US006712177B2

(12) United States Patent
Ureda

(10) Patent No.: US 6,712,177 B2
(45) Date of Patent: Mar. 30, 2004

(54) CROSS-FIRED MULTIPLE HORN LOUDSPEAKER SYSTEM

(76) Inventor: Mark S. Ureda, 1066 Castlerock La., Santa Ana, CA (US) 92705

( * ) Notice: Subject to any disclaimer, the term of this patent is extended or adjusted under 35 U.S.C. 154(b) by 0 days.

(21) Appl. No.: 09/870,438

(22) Filed: May 30, 2001

(65) Prior Publication Data

US 2002/0038740 A1 Apr. 4, 2002

Related U.S. Application Data

(60) Provisional application No. 60/207,811, filed on May 30, 2000.

(51) Int. Cl.$^{7}$ .................................................. H05K 5/00

(52) U.S. Cl. ....................... 181/152; 181/187; 181/192; 181/194; 181/195

(58) Field of Search ................................ 181/144, 145, 181/152, 154, 159, 177, 182, 187, 188, 189, 190, 192, 194, 195

(56) References Cited

U.S. PATENT DOCUMENTS

| | | | | |
|---|---|---|---|---|
| D59,625 S | | 11/1921 | Dodge | |
| 1,616,474 A | | 2/1927 | Stehlin | |
| 1,744,101 A | | 1/1930 | Brandstrom | |
| 1,752,526 A | | 4/1930 | Hinckley | |
| 1,754,425 A | | 4/1930 | Hinckley | |
| 1,762,050 A | | 6/1930 | Cook | |
| 2,058,132 A | | 10/1936 | Cirelli | |
| 2,127,110 A | | 8/1938 | Farrand | |
| 2,746,558 A | | 5/1956 | Levy | |
| 2,751,996 A | | 6/1956 | Levy | |
| 3,292,571 A | | 12/1966 | Watters | |
| 3,649,776 A | | 3/1972 | Burton | |
| 3,930,561 A | | 1/1976 | Klayman | |
| 4,176,731 A | | 12/1979 | Sinclair | |
| 4,187,926 A | | 2/1980 | Henricksen et al. | |
| 4,325,456 A | | 4/1982 | Ureda | |
| 4,336,425 A | | 6/1982 | Renkus | |
| 4,469,921 A | | 9/1984 | Kinoshita | |
| 4,531,608 A | | 7/1985 | Heinz | |
| 4,583,245 A | | 4/1986 | Gelow et al. | |
| 4,723,289 A | | 2/1988 | Schreiber et al. | |
| 4,860,367 A | * | 8/1989 | Hook | 181/152 |
| 4,932,060 A | | 6/1990 | Schreiber | |
| 4,982,436 A | | 1/1991 | Cowan | |
| 5,025,886 A | | 6/1991 | Jung | |
| 5,321,388 A | | 6/1994 | Biersach | |
| 5,526,456 A | | 6/1996 | Heinz | |
| 5,715,322 A | | 2/1998 | Yoshioka et al. | |
| 5,750,943 A | | 5/1998 | Heinz | |
| 5,784,474 A | | 7/1998 | Kohut et al. | |
| 6,035,051 A | * | 3/2000 | Sato | 181/152 |

FOREIGN PATENT DOCUMENTS

| | | |
|---|---|---|
| GB | 362959 A | 12/1931 |
| GB | 560355 A | 3/1944 |

OTHER PUBLICATIONS

Research Council of the Academy of Motion Picture Arts and Sciences; *Motion Picture Sound Engineering, 6th Edition*; D.Van Nostrand Company, Inc., NY.; p. 101.

www.alteclansing.com ( . . . /system.ada3052.html; . . . / newsletters/vol3issue1/comdex/html; . . . Newsletters/ vol2issuer2/golden/html) *Altec Lansing Website* printed Oct. 20, 1999; 6 pages.

* cited by examiner

*Primary Examiner*—Khanh Dang
(74) *Attorney, Agent, or Firm*—Knobbe, Martens, Olson & Bear, LLP

(57) ABSTRACT

The invention relates to a horn loudspeaker system. The horn loudspeaker system includes a pair of vertically displaced horns with cross-fired aiming angles. A common throat section couples the horns to a driver. A substantially asymmetrical baffling is incorporated into the loudspeaker system to further improve the acoustic performance. One advantage of the unique horn loudspeaker system is that it provides a wide horizontal directivity response. Another advantage is that it provides a narrow vertical directivity response.

59 Claims, 25 Drawing Sheets

CROSS-FIRED MULTIPLE HORN LOUDSPEAKER SYSTEM

RELATED APPLICATION

This application claims the benefit of U.S. Provisional Application No. 60/207,811, filed May 30, 2000.

BACKGROUND OF THE INVENTION

1. Field of the Invention

The present invention relates generally to horn loudspeakers, and in particular, to a system of vertically offset horn loudspeakers with a common throat section and cross-fired aiming angles.

2. Background of the Related Art

Horn loudspeakers are used for sound reinforcement, public address, paging, announcement, warning systems and the like. Typical venues include stadiums, arenas, parks, beaches, schools, public buildings, factories, distribution centers, shopping malls, hotels, airports, and mass transit areas.

In many situations it is desirable to provide wide horizontal polar response, substantially constant with frequency, to cover a broad target such as seating areas within a stadium. Similarly, it is desirable to provide narrow vertical polar response, substantially constant with frequency, to focus the sound energy into the audience area. Also, in certain highly reverberant venues such as cathedrals and train stations, narrow vertical polar response can mitigate or reduce undesirable sound reflections off hard floors and ceilings, thereby improving the sound quality.

One typical horn loudspeaker, as known in the art, utilizes a pair of horn elements horizontally positioned next to each other. This conventional side-by-side horn loudspeaker produces narrow horizontal polar response and wide vertical polar response, particularly at low and mid frequencies. Moreover, the polar response of the side-by-side horn loudspeaker can exhibit interference patterns. The interference can be particularly severe in the horizontal direction and at mid and high frequencies.

SUMMARY OF THE INVENTION

The invention relates to a horn loudspeaker system. The horn loudspeaker system includes a pair of vertically displaced horns with cross-fired aiming angles. A common throat section couples the horns to a driver. A substantially asymmetrical baffling is incorporated into the horn loudspeaker system to further improve the acoustic performance. In one embodiment, the baffling is integrally formed with the sound expansion chambers of the horns to provide an integral unit.

The invention demonstrates certain advantages and benefits over conventional horn systems. One advantage of the novel cross-fired horn loudspeaker system is that it provides improved polar response. The horizontal polar response is desirably wide, substantially smooth, substantially symmetric, and substantially constant with frequency. The wide horizontal polar response covers broad target areas. Additionally, the vertical polar response is desirably narrow, substantially constant with frequency and results in increased gain, or energy focusing, and reduced undesirable reflections.

The utilization of a single driver in certain embodiments saves on costs. The drivers are typically one of the more expensive components of a horn system. The drivers are also heavy, and the use of a single driver lowers the system weight. This desirably reduces the structural requirements of the mounting system resulting in cost savings.

Other advantages are provided in certain embodiments by the integral construction of the cross-fired horn elements and the baffling. The integral construction further aids in ease of installation, improves aiming accuracy, and saves installation time, as opposed to mounting and orienting multiple horn and driver components. The timesavings desirably translate into additional cost savings.

The ease of system installation also addresses safety issues. In many cases, loudspeaker systems have to be mounted on poles, roofs, ceilings, and the like. The invention, by providing a low system weight and an integral horn-baffling unit reduces the chances of accidents during installation and in subsequent use.

The flexibility in the selection of the throat configuration adds to the versatility and utility of the invention. The throats of the cross-fired horn loudspeaker can be optimized for a particular application to achieve certain benefits and advantages. For example, the throats can be configured to provide a generally compact design, an extended high frequency response, and an extended low frequency response, among others, as required or desired.

The horn mouth sizes and shapes, the number of horn elements, the horn element coverage, and the horn element aiming can be selected, as required or desired, for a particular application. This flexibility in choice further adds to the versatility and utility of the invention.

For purposes of summarizing the invention, certain aspects, advantages and novel features of the invention have been described herein above. Of course, it is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

These and other embodiments of the present invention will also become readily apparent to those skilled in the art from the following detailed description of the preferred embodiments having reference to the attached figures, the invention not being limited to any particular embodiment(s) disclosed.

DETAILED DESCRIPTION OF THE PREFERRED EMBODIMENTS

Figure 1:
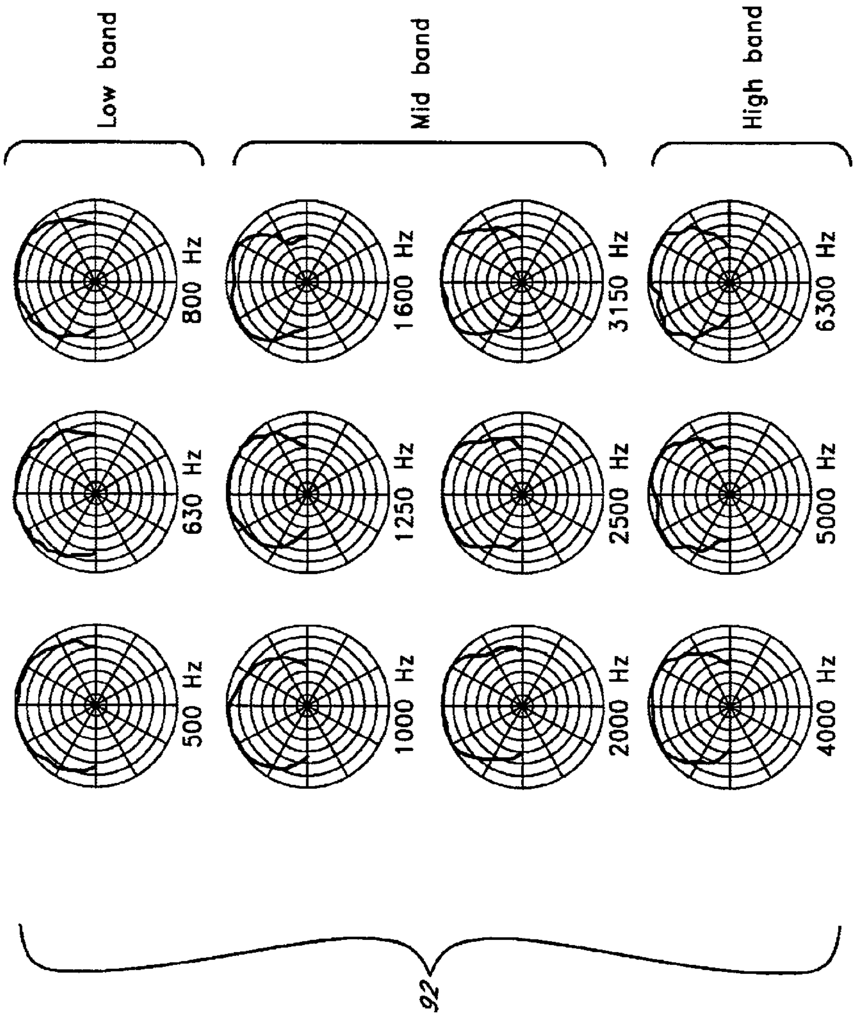
FIG. 1 is a graphical representation of the experimentally measured horizontal polar response curves of a cross-fired horn loudspeaker.

FIG. 1 is a graphical representation of the horizontal polar responses 92, over a range of frequencies, of a cross-fired horn loudspeaker in accordance with one embodiment of the invention. As discussed in greater detail later herein, in one embodiment, the cross-fired horn loudspeaker comprises a pair of vertically displaced or offset horns, horn sections, or horn elements with "cross-fired" aiming angles and a common throat section.

These polar response charts 92 were generated utilizing known experimental and theoretical techniques. The horizontal polar response plots 92 indicate that the cross-fired horn loudspeaker desirably provides a generally wide, substantially smooth, substantially symmetric and substantially constant with frequency horizontal polar response. This smooth and symmetric response is attributable at least partially to the cross-fired horn elements, the asymmetric baffling and/or the common throat section of the cross-fired horn loudspeaker system.

Figure 2:
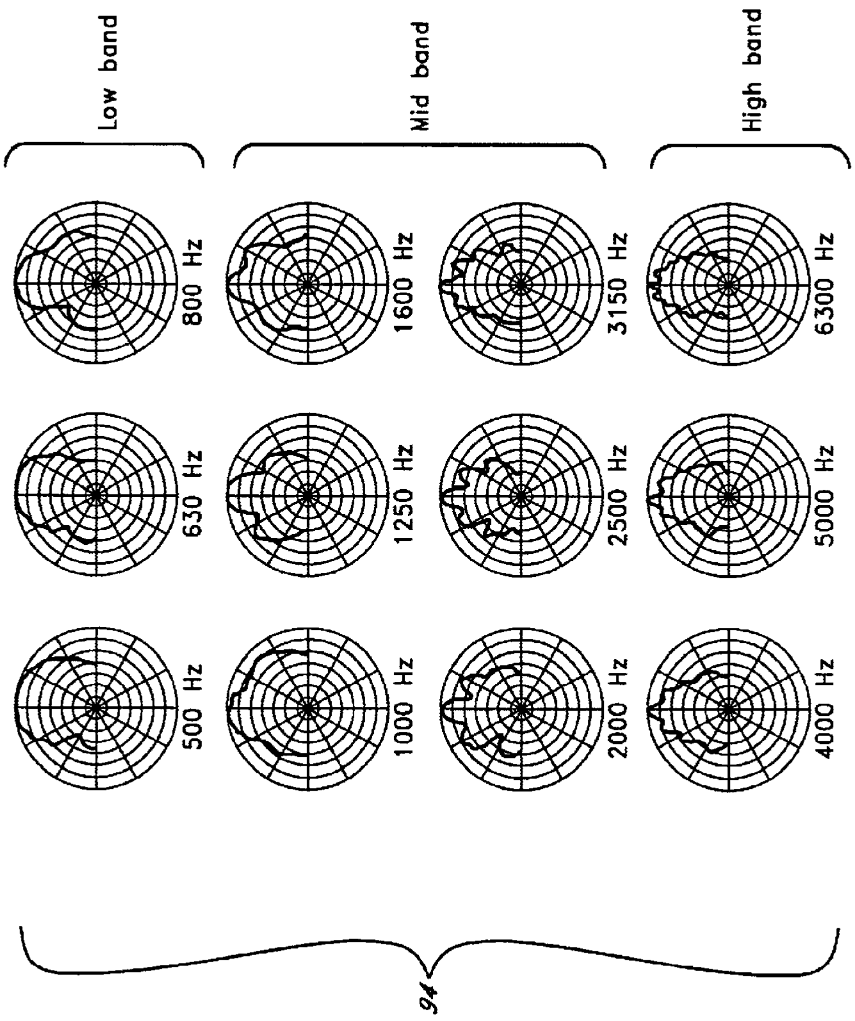
FIG. 2 is a graphical representation of the experimentally measured vertical polar response curves of a cross-fired horn loudspeaker.

FIG. 2 is a graphical representation of the vertical polar responses 94, over a range of frequencies, of a cross-fired horn loudspeaker in accordance with one embodiment of the invention. These polar response charts 94 were generated utilizing known experimental and theoretical techniques. The vertical polar response plots 94 indicate that the cross-fired horn loudspeaker desirably provides a generally narrow vertical polar response, substantially constant frequency. This generally narrow response is attributable at least partially to the vertically displaced horn sections.

Figure 3:
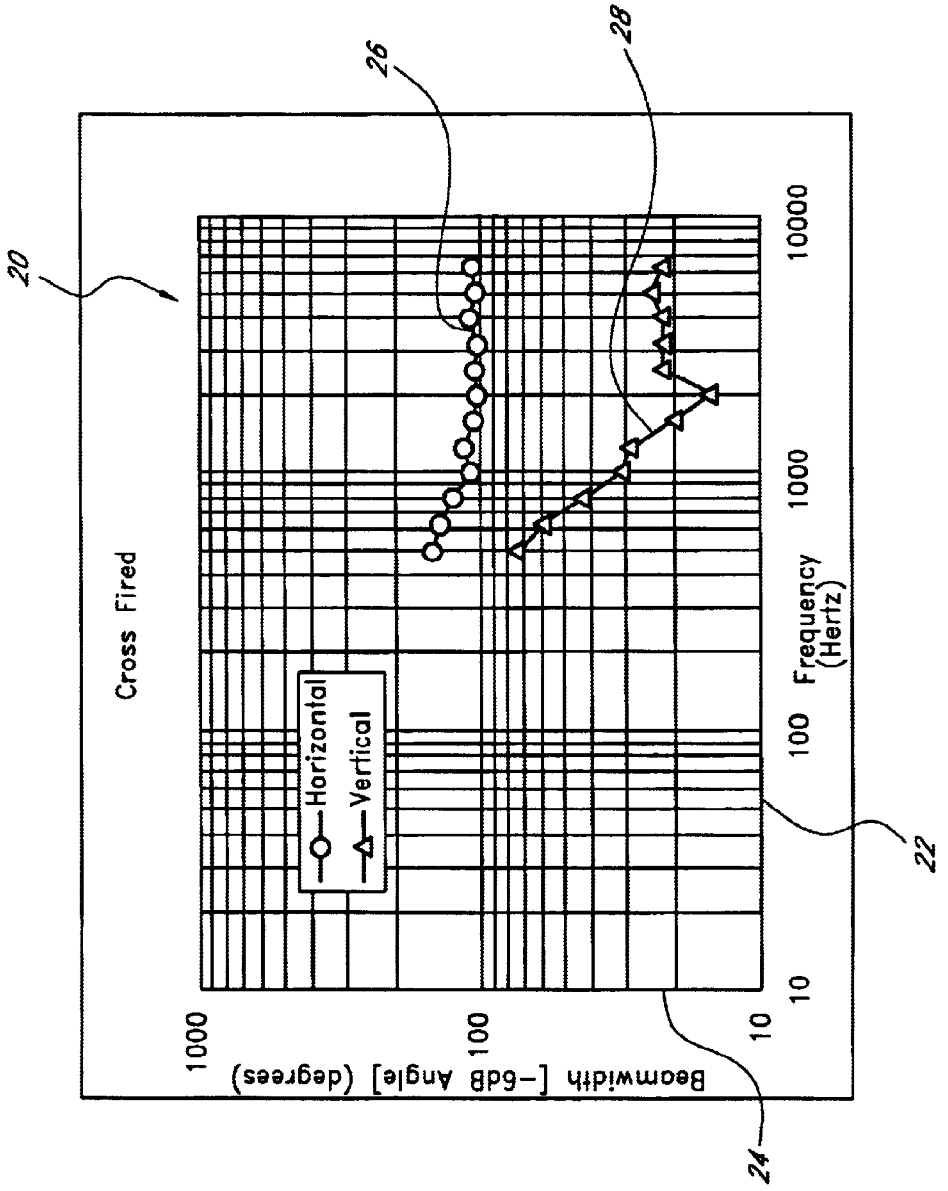
FIG. 3 is a graph based on experimentally measured data illustrating the directivity response of a cross-fired horn loudspeaker of the invention.
Figure 4:
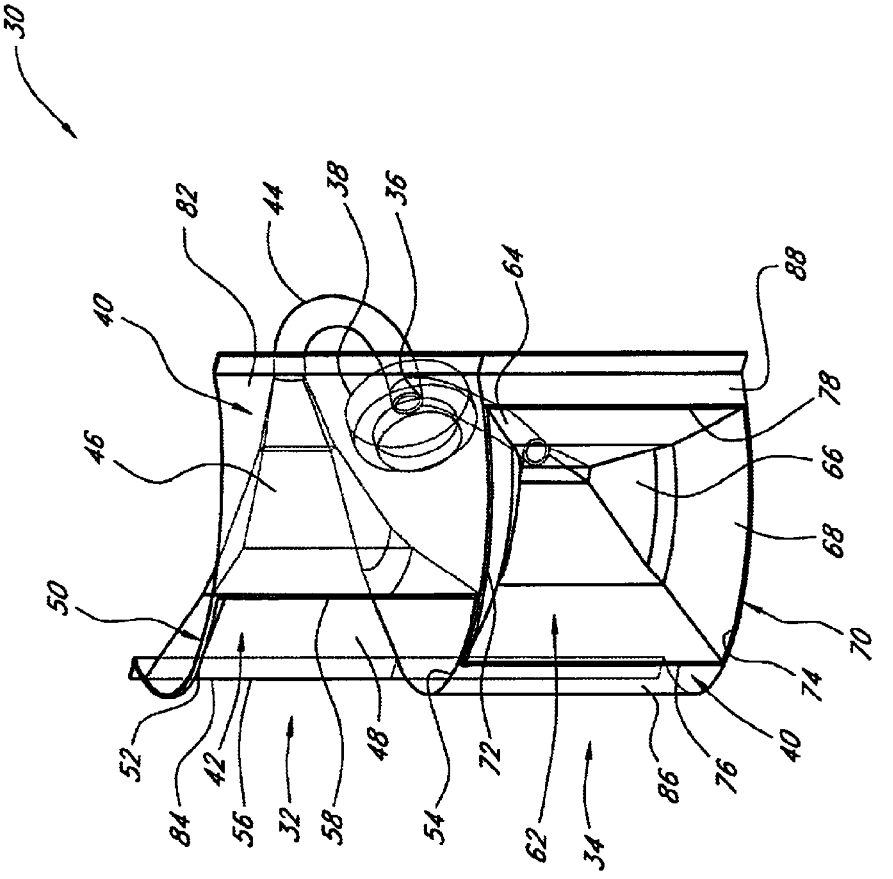
FIG. 4 is a schematic perspective view of a cross-fired horn loudspeaker having features in accordance with one embodiment of the invention.
Figure 5:
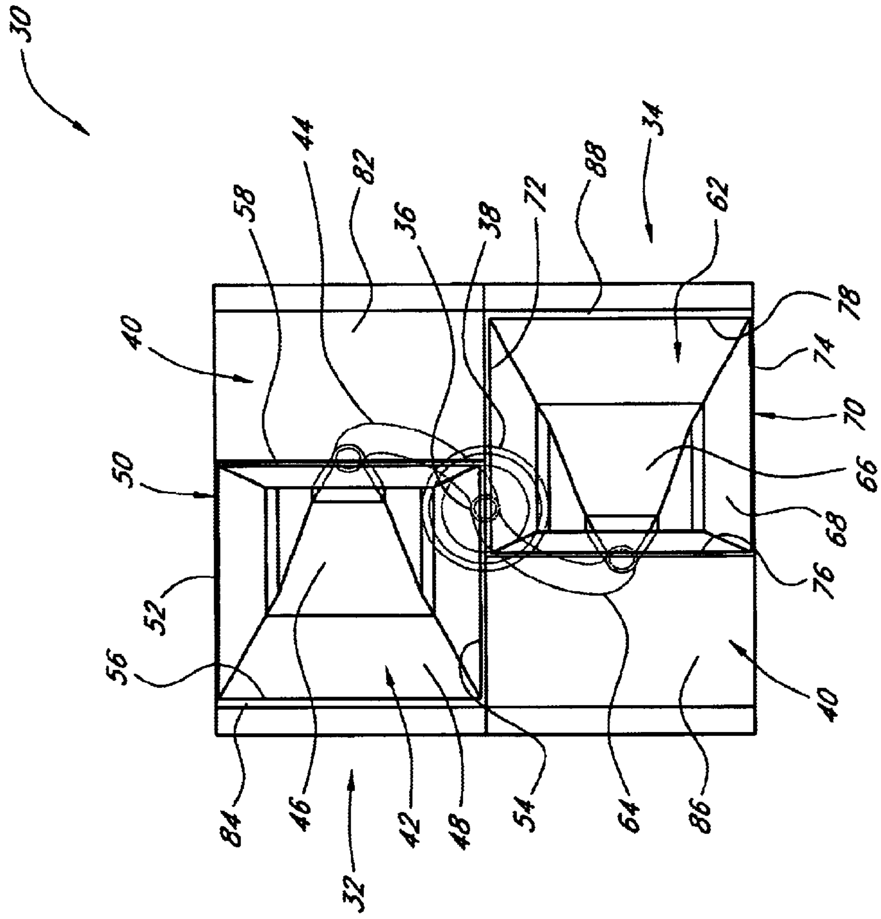
FIG. 5 is a schematic front elevation view of the cross-fired horn loudspeaker of FIG. 4.

FIG. 3 is a directivity response graph 20 illustrating the directivity response of a cross-fired horn loudspeaker in accordance with one embodiment of the invention. The directivity response graph 20 includes an x-axis 22 representing the frequency in units of Hertz (Hz) and a y-axis 24 representing the beamwidth angle in degrees (°). As is known in the art, the beamwidth is defined as the included angle between the −6 dB points on the corresponding polar response curves and the directivity response is the beamwidth over the frequency range of interest.

Line 26 depicts the empirically determined horizontal directivity response of a cross-fired horn loudspeaker of the invention. The horizontal directivity response 26 shows that the beamwidth angle is between about 100° and 120° over a frequency range from about 1000 Hz to greater than 6 kHz. This illustrates that the cross-fired system of the invention desirably achieves a wide and substantially constant horizontal directivity response.

Line 28 depicts the empirically determined vertical directivity response of a cross-fired horn loudspeaker of the invention. The vertical directivity response 28 shows that the beamwidth angle is between about 15° and 30° over a frequency range from about 1000 Hz to greater than 6 kHz. This illustrates that the cross-fired system of the invention desirably achieves a narrow and substantially constant vertical directivity response.

Cross-Fired Horn Loudspeaker System

FIGS. 4 to 7 show respective schematic perspective, front, top and side views of a cross-fired multiple horn loudspeaker sound system, assembly, combination, or apparatus 30 having features in accordance with one embodiment of the invention. The cross-fired horn loudspeaker system 30 generally comprises a pair of vertically displaced or offset horns, or horn elements/modules/sections 32, 34 with cross-fired aiming angles. In one embodiment, the horns 32, 34 are in acoustical communication with a common throat section or divider 36 connected to a compression driver unit or assembly 38.

In one embodiment, and as discussed in greater detail later herein, a baffle system or structure 40 is integrally formed or molded with the horns 32, 34. This further improves the acoustic performance of the cross-fired horn loudspeaker system 30. In other embodiments, the horns 32, 34 can be mounted or housed in the baffling 40.

The upper first horn 32 comprises a sound expansion chamber 42 in acoustical communication with a throat 44 which in turn is in acoustical communication with the common throat section 36. The sound expansion chamber 42 includes a bell portion or section 46 and a flange portion or section 48 which forms a mouth 50 at the sound radiating end of the first horn 32.

The bell section 46 is positioned intermediate the throat 44 and the flange section 48. In one embodiment, the bell section 46 forms a generally flared sound transmitting passage and includes a plurality of flared internal surfaces. The direction of the flare is towards the horn mouth 50.

In one embodiment, the flange section 48 forms a generally flared sound transmitting passage and includes a plurality of flared internal surfaces. The direction of the flare is towards the horn mouth 50. In one embodiment, the mouth 50 has substantially radial top and bottom edges 52, 54 in the horizontal plane, with generally straight side edges 56, 58 in the vertical plane, and a substantially rectangular cross-sectional shape in a projection on a plane normal to the outbound longitudinal axis 80 (defined later herein). In other embodiments, the horn mouth edges 52, 54, 56, and 58 may be shaped in a wide variety of manners, for example, curved, straight or irregular, among others, in both the horizontal and/or vertical planes, and the mouth cross-section may be shaped in a wide variety of manners, for example, rectangular, square, oval, round or irregular, among others, in a projection on a plane normal to the outbound longitudinal axis 80 (defined later herein).

The throat 44 is part of a sound transmitting passage originating at the common throat section 36 and terminating at the mouth 50. The throat 44 can be coupled to the sound expansion chamber 42 in a wide variety of manners, for example, by utilizing suitable mounting flanges, connectors, couplings, and the like, giving due consideration to the goal of providing acoustical communication between the throat 44 and the sound expansion chamber 42. In other embodiments, the throat 44 is in a continuous transition with the sound expansion chamber 42 to form an integral unit.

In one embodiment, the inner diameter, cross-section, or other appropriate area scale of the throat 44 generally increases in the direction commencing from the common throat section 36 and leading towards the sound expansion chamber 42. This increase in throat size can be generally steady, linear, exponential, irregular, stepped or non-linear, among other configurations.

The lower second horn 34 comprises a sound expansion chamber 62 in acoustical communication with a throat 64 which in turn is in acoustical communication with the common throat section 36. The sound expansion chamber 62 includes a bell portion or section 66 and a flange portion or section 68 which forms a mouth 70 at the sound radiating end of the second horn 34.

The bell section 66 is positioned intermediate the throat 64 and the flange section 68. In one embodiment, the bell section 66 forms a generally flared sound transmitting passage and includes a plurality of flared internal surfaces. The direction of the flare is towards the horn mouth 70.

In one embodiment, the flange section 68 forms a generally flared sound transmitting passage and includes a plurality of flared internal surfaces. The direction of the flare is towards the horn mouth 70. In one embodiment, the mouth 70 has substantially radial top and bottom edges 72, 74 in the horizontal plane, with generally straight side edges 76, 78 in the vertical plane, and a substantially rectangular cross-sectional shape in a projection on a plane normal to the outbound longitudinal axis 90 (defined later herein). In other embodiments, the horn mouth edges 72, 74, 76, and 78 may be shaped in a wide variety of manners, for example, curved, straight or irregular, among others, in both the horizontal and/or vertical planes, and the mouth cross-section may be shaped in a wide variety of manners, for example, rectangular, square, oval, round or irregular, among others, in a projection on a plane normal to the outbound longitudinal axis 90 (defined later herein).

The throat 64 is part of a sound transmitting passage originating at the common throat section 36 and terminating at the mouth 70. The throat 64 can be coupled to the sound expansion chamber 62 in a wide variety of manners, for example, by utilizing suitable mounting flanges, connectors, couplings, and the like, giving due consideration to the goal of providing acoustical communication between the throat 64 and the sound expansion chamber 62. In other embodiments, the throat 64 is in a continuous transition with the sound expansion chamber 62 to form an integral unit.

In one embodiment, the inner diameter, cross-section, or other appropriate area scale of the throat 64 generally increases in the direction commencing from the common throat section 36 and leading towards the sound expansion chamber 62. This increase in throat size can be generally steady, linear, exponential, irregular, stepped or non-linear, among other configurations.

In one embodiment, the sound expansion chambers 42, 62 and throats 44, 64 of the respective horns 32, 34 are configured and/or dimensioned substantially identically. In another embodiment, the sound expansion chambers 42, 62 and throats 44, 64 comprise different dimensions. Furthermore, in other embodiments, more than two horns, or horn elements, may be used.

The common throat section 36 essentially serves as a sound divider for distributing the sound energy from the compression driver 38 between the top first horn 32 and the bottom second horn 34 of the cross-fired horn loudspeaker system 30. The divider 36 can be coupled to the driver 38 and the first and second throats 44, 64 in a wide variety of manners, for example, by utilizing suitable mounting flanges, connectors, couplings, and the like, giving due consideration to the goal of providing acoustical communication between the driver 38 and the throats 44, 64. In one embodiment, the common throat section 36 is integrally formed or molded with the throats 44, 64.

The driver unit 38 comprises one or more compression drivers and is coupled to the common throat section 36. The driver 38 serves as a transducer to convert and/or transform electrical signals or energy into sound waves, signals or energy. Any one of a number of commercially available compression drivers may be utilized with the cross-fired horn loudspeaker system 30 of the invention, giving due consideration to the goal of achieving one or more of the benefits and advantages as taught or suggested herein.

Figure 6:
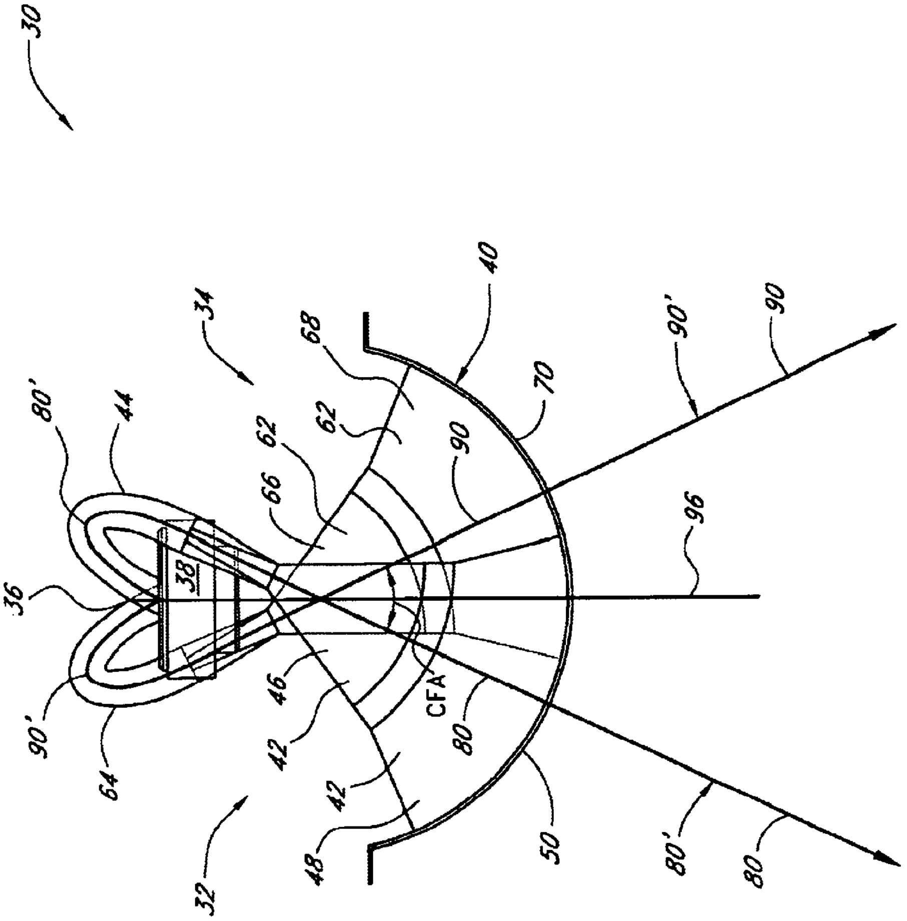
FIG. 6 is a schematic top plan view of the cross-fired horn loudspeaker of FIG. 4.

FIG. 6 (top view) shows the longitudinal axes or centerlines 80', 90' of each of the respective horns 32, 34. The upper horn longitudinal axis or centerline 80' originates at the common throat section 36, travels through, continues or spans the throat 44 and sound expansion chamber 42, and extends outbound through the mouth 50. The lower horn longitudinal axis or centerline 90' originates at the common throat section 36, travels through, continues or spans the throat 64 and sound expansion chamber 62, and extends outbound through the mouth 70. The horn longitudinal axes 80', 90' also define sound paths through the respective horns 32, 34.

The upper horn "outbound" longitudinal axis or centerline 80 comprises a segment of the upper horn axis 80' originating at or near the junction of the upper horn sound expansion chamber 42 and throat 44 and extending outbound through the upper horn mouth 50, or a substantially straight segment of the upper horn axis 80' extending outbound through the upper horn mouth 50. The lower horn "outbound" longitudinal axis or centerline 90 comprises a segment of the lower horn axis 90' originating at or near the junction of the lower horn sound expansion chamber 62 and throat 64 and extending outbound through the lower horn mouth 70, or a substantially straight segment of the lower horn axis 90' extending outbound through the lower horn mouth 70. The bisecting vertical plane 96 is a vertical plane along a line that bisects the projections of the outbound longitudinal axes 80, 90 on a common horizontal plane.

Referring in particular to FIG. 6, the horns 32, 34 are defined to be "cross-fired" when the projections of the horn longitudinal axes or centerlines 80', 90' on a common horizontal plane intersect or cross one another at a point downstream from the driver 38 or common throat section 36 in the direction of the flow of the acoustic signal. The cross-fire angle (CFA) is defined as the angle of intersection between the projections of the outbound longitudinal axes 80, 90 on a common horizontal plane. In certain embodiments, there can be more than one point of intersection of the projections of the horn longitudinal axes or centerlines 80', 90' on a common horizontal plane.

In one embodiment, as seen in FIG. 6, the top horn 32 and the bottom horn 34 vertically overlap. That is, there is an overlap area or region between the projections of the horns 32, 34 (or sound expansion chambers 42, 62) on a common horizontal plane.

It is also convenient to define an "overlap area" as the area of overlap between the projections of the sound chambers of a pair of horns onto a common horizontal plane. Thus, when there is a finite "overlap area" the horns can be referred to as having "vertically overlapping sound chambers."

Figure 7:
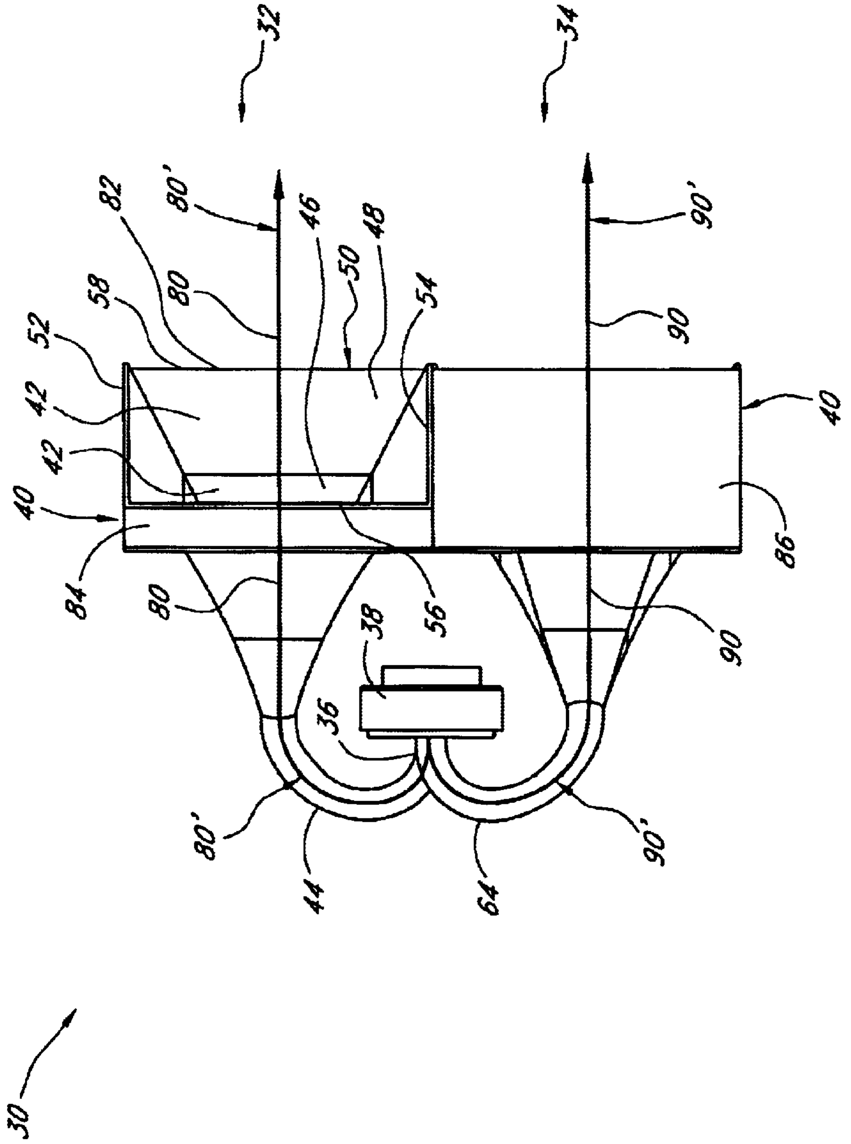
FIG. 7 is a schematic side elevation view of the cross-fired horn loudspeaker of FIG. 4.

FIG. 7 (side view) also illustrates the longitudinal axes or centerlines 80', 90' of each of the respective horns 32, 34. The horns 32, 34 are defined to be "vertically divergent/convergent" when the projections of the outbound horn longitudinal axes or centerlines 80, 90 on the bisecting plane 96 intersect or cross one another. The vertical divergence/convergence angle (VDA) is defined as this angle of intersection. Note that for the embodiment illustrated in FIGS. 4–7, there is no intersection between the projections of the outbound horn longitudinal axes or centerlines 80, 90 on the bisecting vertical plane 96, hence VDA=0° and the horns are referred to as "vertically parallel." In certain embodiments, there can be more than one point of intersection of the projections of the horn longitudinal axes or centerlines 80', 90' on the bisecting vertical plane 96.

Referring to FIGS. 4–7, a substantially asymmetric baffle system or structure 40 is integrally formed or molded with the horns 32, 34 to further improve the acoustic performance of the cross-fired horn loudspeaker system 30. The baffling 40 functions to substantially prevent or mitigate undesirable diffraction and interaction between the sound waves or signals broadcasted from the top horn 32 and the bottom horn 34 and the cavities formed between the top horn 32 and the bottom horn 34.

In one embodiment, the baffle system 40 is generally associated with the sides of the top sound expansion chamber 42 near the mouth 50 and the bottom sound expansion chamber 62 near the mouth 70. In one embodiment, the baffling 40 is in mechanical communication with the sound expansion chambers 42, 62. The baffling 40 generally comprises baffle elements 82, 84, 86, 88. The baffle elements 82, 84 are associated with the top sound expansion chamber 42 with the baffle element 82 being substantially wider than the baffle element 84. Similarly, the baffle elements 86, 88 are associated with the bottom sound expansion chamber 62 with the baffle element 86 being substantially wider than the baffle element 88.

The substantially wide top baffle element 82 is positioned generally above and in mechanical communication with the substantially narrow bottom baffle element 88. The substantially narrow top baffle element 84 is positioned generally above and in mechanical communication with the substantially wide bottom baffle element 86. This configuration and dimensional contrast between the baffle elements 82, 84, 86, 88 gives rise to the desirable asymmetry of the baffling 40. In turn, this causes a further improvement in the acoustical performance of the cross-fired horn loudspeaker system 30 of the invention.

In other embodiments, the baffle system 40 can be configured and dimensioned in a wide variety of manners with efficacy, as required or desired, giving due consideration to the goal of achieving one or more of the benefits and advantages as taught or suggested herein. Baffle elements can also be provided along the top and/or bottom edges of sound expansion chamber 42 near the mouth 50 and/or the top and/or bottom edges of sound expansion chamber 62 near the mouth 70, giving due consideration to the goal of further enhancing the acoustical performance of the cross-fired horn loudspeaker system 30 of the invention.

In another embodiment, the baffle system 40 is autonomous from the sound expansion chambers 42, 62. As the skilled artisan will realize, the baffling 40 can be coupled to the sound expansion chambers 42, 62 utilizing a wide variety of techniques, for example, screws, nut-bolt combinations, rivets, clamps, adhesives, or combinations thereof, among others.

In one embodiment, the top sound expansion chamber 42, the bottom sound expansion chamber 62 and the baffling 40 are formed by an injection molding process. This results in an integral unit comprising the sound expansion chambers 42, 62 and the baffling 40.

In another embodiment, the top sound expansion chamber 42, the bottom sound expansion chamber 62, the throats 44, 64, and the baffling 40 are formed by an injection molding process to form an integral unit. In other embodiments, as the skilled artisan will realize, the cross-fired horn loudspeaker system 30 of the invention can be fabricated in a wide variety of manners, for example, utilizing machining, forging, casting, or combinations thereof, among others.

The throats 44, 64 are coupled to the respective sound expansion chambers 42, 62 and to the divider or common throat section 36. In turn, the divider 36 is connected to the driver unit 38. This completes the assembly and formation of the cross-fired horn loudspeaker system 30. The particular sequence in which the above connections, involving the throats 44, 64, the sound expansion chambers 42, 62, the divider 36, and the driver 38, are carried out is usually not of critical importance. Thus, the order in which these connection steps are performed can be chosen, as required or desired.

The sound expansion chambers 42, 62 are preferably fabricated from a substantially non-resonant, structural material. For example, in one embodiment, the sound expansion chambers 42, 62 are fabricated from a fiberglass material. In another embodiment, the sound expansion chambers 42, 62 are fabricated from a polyester material. In other embodiments, the sound expansion chambers 42, 62 can be fabricated from a wide variety of materials.

The baffling 40 is preferably fabricated from a substantially non-resonant, structural material. For example, in one embodiment, the baffling 40 is fabricated from a fiberglass material. In another embodiment, the baffling 40 is fabricated from a polyester material. In other embodiments, the baffling 40 can be fabricated from a wide variety of materials.

The throats 44, 64 are preferably fabricated from a substantially non-resonant, structural material. For example, in one embodiment, the throats 44, 64 are fabricated from a fiberglass material. In another embodiment, the throats 44, 64 are fabricated from a polyester material. In a further embodiment, the throats 44, 64 are fabricated from a metal, for example, by metal casting. In other embodiments, the throats 44, 64 can be fabricated from a wide variety of materials.

The common throat section or divider 36 is preferably fabricated from a substantially non-resonant, structural material. For example, in one embodiment, the divider 36 is fabricated from a fiberglass material. In another embodiment, the divider 36 is fabricated from a polyester material. In a further embodiment, the divider 36 is fabricated from a metal, for example, by metal casting. In other embodiments, the divider 36 can be fabricated from a wide variety of materials.

Cross-Fired Horn Overlap Configurations

The invention can be embodied with a plurality of cross-fired horn configurations. As defined above, the cross-fire angle CFA is the angle of intersection between the projections of the outbound horn longitudinal axes or centerlines 80, 90 on a common horizontal plane, and hence is a measure of the angular offset or angulation (in a generally horizontal plane) between the vertically offset cross-fired horns 32, 34 and/or the respective sound expansion chambers 42, 62. It is also convenient to define an "overlap area" as the area of overlap between the projections of the sound chambers of a pair of horns onto a common horizontal plane. Thus, when there is a finite "overlap area" the horns can be referred to as having "vertically overlapping sound chambers."

In accordance with one embodiment of the invention, the vertically displaced cross-fired horns are configured so that there is no "overlap area" between the horn sound chambers. Hence, the horns do not have "vertically overlapping sound chambers." In this embodiment, the projections of the horn outbound longitudinal axes or centerlines on a common horizontal plane intersect behind the projections on a common horizontal plane of one or both of the horn sound chambers.

In accordance with one embodiment of the invention, the vertically displaced cross-fired horns are configured so that there is a small "overlap area" between the horn sound chambers. Hence, the horns have "vertically overlapping sound chambers." In this embodiment, the projections of the outbound horn longitudinal axes or centerlines on a common horizontal plane intersect substantially at or near the projections on a common horizontal plane of the junctions of one or both of the horn sound chambers and respective throats.

Referring to FIG. 6, in accordance with one embodiment of the invention, the vertically displaced cross-fired horns are configured so that there is an "overlap area" between the horn sound chambers. Hence, the horns have "vertically overlapping sound chambers." In this embodiment, the projections of the outbound horn longitudinal axes or centerlines on a common horizontal plane intersect within the overlap area of the projections on a common horizontal plane of the horn sound chambers.

In accordance with one embodiment of the invention, the vertically displaced cross-fired horns are configured so that there is an "overlap area" between the horn sound chambers. Hence, the horns have "vertically overlapping sound chambers." In this embodiment, the projections of the outbound horn longitudinal axes or centerlines on a common horizontal plane intersect substantially at or near the projections on a common horizontal plane of one or both of the horn mouths.

In accordance with one embodiment of the invention, the vertically displaced cross-fired horns are configured so that there is substantially no "overlap area" between the horn sound chambers. Hence, the horns do not have "vertically overlapping sound chambers." In this embodiment, the projections of the outbound horn longitudinal axes or centerlines on a common horizontal plane intersect ahead or in front of the projections on a common horizontal plane of one or both of the horn mouths.

In accordance with one embodiment of the invention, the vertically displaced cross-fired horns are configured so that there is no "overlap area" between the horn sound chambers. Hence, the horns do not have "vertically overlapping sound chambers." In this embodiment, the projections of the outbound horn longitudinal axes or centerlines on a common horizontal plane intersect ahead or in front of the projections on a common horizontal plane of one or both of the horn mouths.

Vertically Divergent/Convergent Horn Configurations

The invention can be embodied with a plurality of cross-fired vertically divergent/convergent horn configurations. As defined above, the vertical divergence/convergence angle VDA is the angle of intersection between the projections of the outbound horn longitudinal axes or centerlines 80, 90 on the bisecting vertical plane 96, and hence is a measure of the angular offset or angulation (in a generally vertical plane) between the horns 32, 34 and/or the respective sound expansion chambers 42, 62.

In one embodiment, and referring to FIG. 7, the horn sound expansion chambers 42, 62 are positioned so that there is no intersection or crossover between the projections of the outbound horn longitudinal axes or centerlines 80, 90 on the bisecting vertical plane 96. That is, VDA=0°, and the horns 32, 34 are vertically parallel. The horns 32, 34 (or sound expansion chambers 42, 62) can also be shifted longitudinally, or laterally, or both while maintaining their vertical parallelness (VDA=0°).

In another embodiment, the vertically offset horn sound chambers are positioned to provide a vertically divergent cross-fired system. For a vertically divergent system, in one embodiment, the horn mouths point vertically outwardly away from one another and the projections of the outbound horn longitudinal axes or centerlines on the bisecting vertical plane 96, intersect or crossover at a point generally behind the horn mouths. The angle at this point of intersection is the vertical divergence angle of the cross-fired system. The lower horn outbound longitudinal axis is chosen as a "reference axis" to indicate a vertical divergence angle VDA>0°.

In yet another embodiment, the vertically offset horn sound chambers are positioned to provide a vertically convergent cross-fired system. For a vertically convergent system, in one embodiment, the horn mouths point vertically inwards towards one another and the projections of the outbound horn longitudinal axes or centerlines on the bisecting vertical plane 96, intersect or crossover at a point generally ahead or in front of the horn mouths. The angle at this point of intersection is the vertical convergence angle of the cross-fired system. The lower horn outbound longitudinal axis is chosen as a "reference axis" to indicate a vertical convergence angle VDA<0°.

Cross-Fire Angles (CFA) and Vertical Divergence/Convergence Angles (VDA)

For a given horn section, the "nominal dispersion angles" (NDA) are industry standard terms that refer to the angles between the 6 dB down points both in a horizontal and vertical direction across a wide frequency range and generally above the break frequency $F_b$, that is, the included angles between the −6 dB points on the corresponding polar response curves. The break frequency $F_b$ is typically defined by the relation:

$$F_b = \frac{10^6}{\theta x} \tag{1}$$

where, θ is the physical flare angle formed by sides or top and bottom of the horn through the sound expansion chamber in either the horizontal or vertical plane and x is the nominal width of the horn mouth (for the horizontal break frequency) or the nominal height of the horn mouth (for the vertical break frequency). Hence a horn will have independent break frequencies for its horizontal directivity response and its vertical directivity response. The horizontal break frequency is established using the break frequency equation and the horn mouth width and physical horizontal flare angle. The vertical break frequency is established using the break frequency equation and the horn mouth height and the physical vertical flare angle. For a given industry horn the nominal dispersion angles are listed by the manufacturer, for example, 60°×40° refers to a nominal horizontal dispersion angle of 60° and a nominal vertical dispersion angle of 40°.

In one embodiment of the invention, the cross-fire angle (CFA) is selected based on the following relation:

$$CFA = \frac{NDA_{H-1} + NDA_{H-2}}{K} \tag{2}$$

where, $NDA_{H-2}$ is the nominal horizontal dispersion angle of the first horn (for example, the horn 32), $NDA_{H-2}$ is the nominal horizontal dispersion angle of the second horn (for example, the horn 34), and K is a parameter that defines the degree of cross-firing. Equation or expression (2) permits the two horns to be oriented at a predetermined cross-fire angle CFA.

In one embodiment, K=2, and the cross-fire angle CFA is the average of the nominal horizontal dispersion angles of the two horns 32, 34. In another embodiment, $1 \leqq K \leqq 4$. In a further embodiment, $1.5 \leqq K \leqq 3$. In other embodiments, K can be selected, as required or desired, to achieve a cross-fire angle in the range from greater than 0° to less than 180°, that is, 0°<CFA<1800.

In one embodiment of the invention, the vertical divergence/convergence angle (VDA) is selected based on the following relation:

$$VDA = \frac{NDA_{V-1} + NDA_{V-2}}{C} \tag{3}$$

where, $NDA_{V-1}$, is the nominal vertical dispersion angle of the first horn (for example, the horn 32), $NDA_{V-2}$ is the nominal vertical dispersion angle of the second horn (for example, the horn 34), and C is a parameter that defines the degree of vertical divergence/convergence. Equation or expression (3) permits the two horns to be oriented at a predetermined vertical divergence/convergence angle VDA.

In one embodiment, C=±∞, and hence VDA=0° so that the horns 32, 34 are vertically parallel. Note that divergence is indicated by VDA>0° and convergence is indicated by VDA<0°, as discussed above. In one vertically divergent embodiment, 3<C<∞. In another vertically divergent embodiment, 1.3<C<3. In yet another vertically divergent embodiment, 0.10<C<1.3. In one vertically convergent embodiment, $-\infty < C \leqq -3$. In another vertically convergent embodiment, $-3 < C \leqq -1.3$. In yet another vertically convergent embodiment, $-1.3 < C \leqq -0.10$. In other embodiments, C can be selected, as required or desired, to achieve a vertical divergence/convergence angle in the range from −180° to 180°, that is, $-180° \leqq VDA \leqq 180°$.

The cross-fire angles (CFA) and/or the vertical divergence/convergence angles (VDA) can be selected in a wide variety of manners with efficacy, as required or desired, giving due consideration to the goal of achieving one or more of the benefits and advantages as taught or suggested herein. This adds to the versatility of the invention, for example, in the choice of coverage angles, among others. Also, the horns and other components of the cross-fired system can be dimensioned in a wide variety of manners with efficacy, as required or desired, giving due consideration to the particular application.

Throat Configurations

Figure 8:
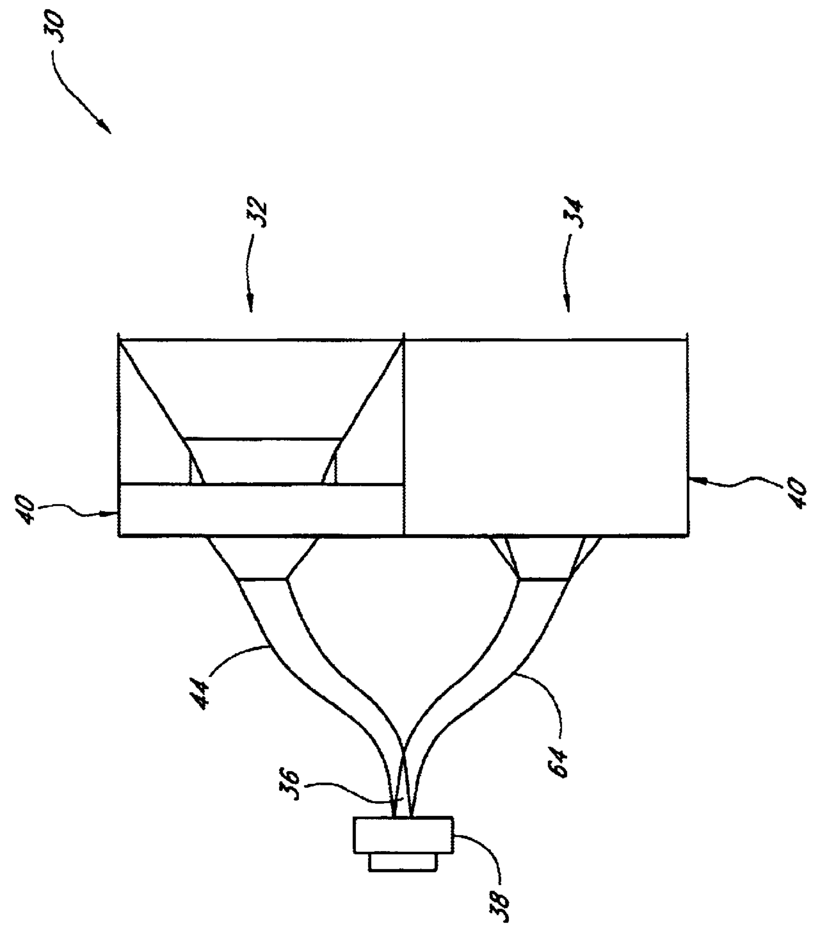
FIG. 8 is a schematic side elevation view of a cross-fired horn loudspeaker illustrating horn throats in accordance with one embodiment of the invention.
Figure 9:
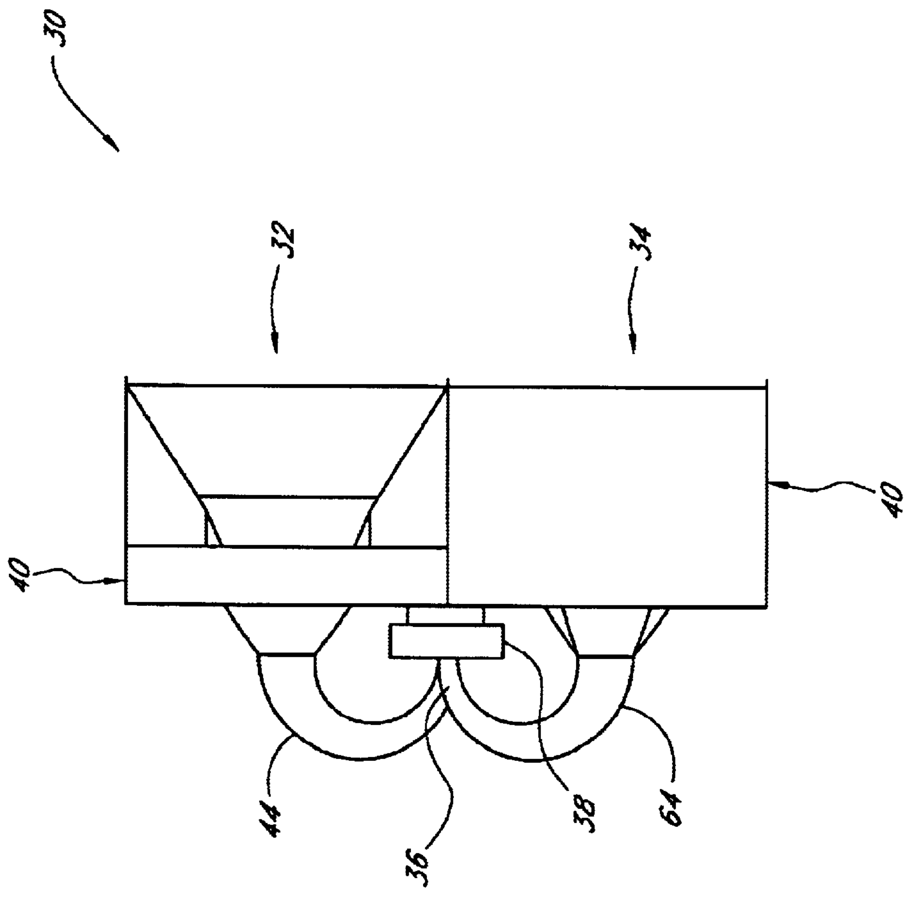
FIG. 9 is a schematic side elevation view of a cross-fired horn loudspeaker illustrating horn throats in accordance with another embodiment of the invention.
Figure 10:
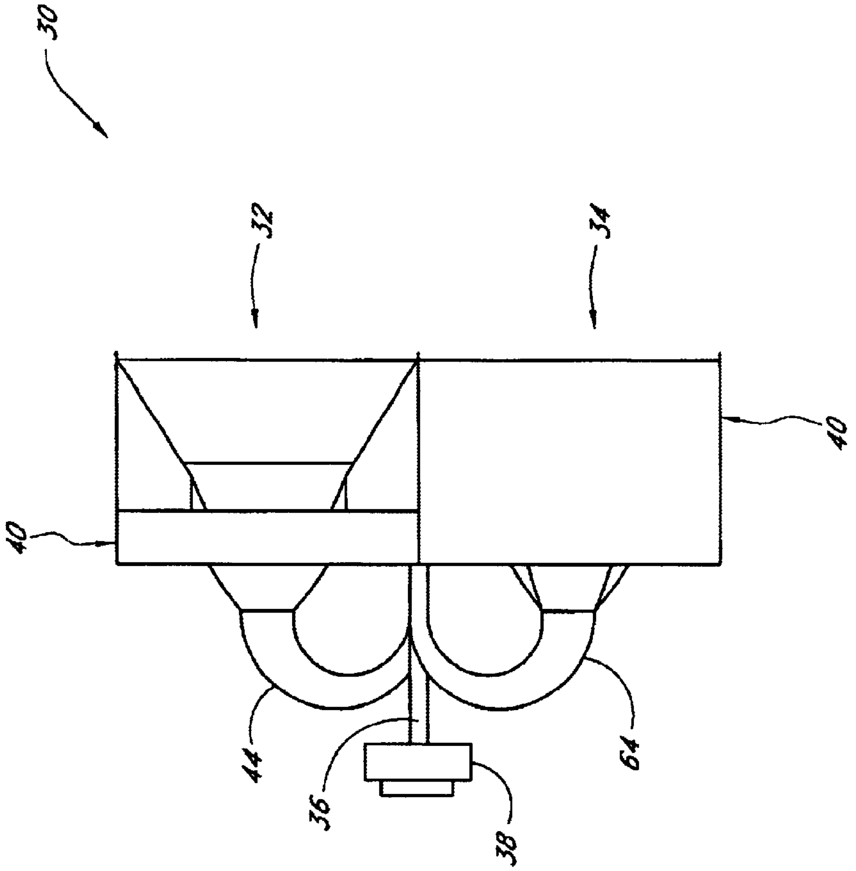
FIG. 10 is a schematic side elevation view of a cross-fired horn loudspeaker illustrating horn throats in accordance with a further embodiment of the invention.

FIGS. 8 to 10 are schematic side elevation views illustrating a plurality of throat configurations for the cross-fired horn loudspeaker system 30 of the invention. The common throat section or divider 36 couples the throats 44, 64 with the driver unit or assembly 38. As illustrated in FIG. 8, in one embodiment, the throats 44, 64 are generally straight (in the projection on a vertical plane.) In another embodiment, shown in FIG. 9, the throats 44, 64 bend to provide a more compact assembly. In yet another embodiment, and referring to FIG. 10, the throats 44, 64 have double bends to provide longer throats 44, 64.

In other embodiments, the throats 44, 64 can be configured and dimensioned in a wide variety of manners with efficacy, as required or desired, giving due consideration to achieving one or more of the benefits and advantages as taught or suggested herein. In general, the throat configuration typically takes into consideration such factors as the desired or required frequency response and/or other operational parameters or physical constraints.

Baffle System Configurations

Figure 11:
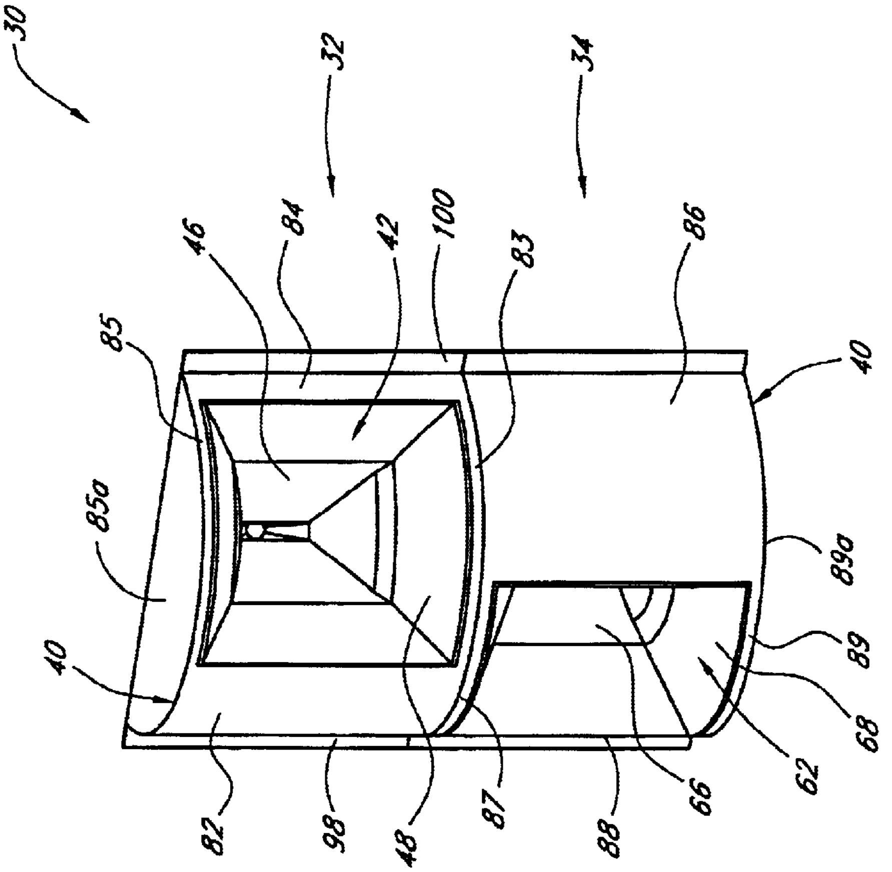
FIG. 11 is a schematic perspective view of a cross-fired horn loudspeaker illustrating a baffling configuration in accordance with one embodiment of the invention.

FIG. 11 is a schematic perspective view of a cross-fired horn loudspeaker 30 illustrating a baffling or baffle system 40 in accordance with one embodiment of the invention. The baffling 40 is substantially asymmetric and generally comprises top baffle elements 82, 84, 83, 85 and bottom baffle elements 86, 88, 87, 89.

The baffle elements 82, 84 are associated with the side edges of the top sound expansion chamber 42 near the mouth 50 with the baffle element 82 being substantially wider than the baffle element 84. The baffle elements 85, 83 are associated with respective upper and lower edges of the upper sound expansion chamber 42 near the mouth 50. Similarly, the baffle elements 86, 88 are associated with the side edges of the bottom sound expansion chamber 62 near the mouth 70 with the baffle element 86 being substantially wider than the baffle element 88. The baffle elements 87, 89 are associated with respective upper and lower edges of the lower sound expansion chamber 62 near the mouth 70.

In one embodiment, baffle elements 82 to 89 can be provided, as required or desired, giving due consideration to the goals of preventing or mitigating undesirable diffraction and interaction between the sound waves or signals broadcasted from the top horn 32 and the bottom horn 34 and the cavities formed between the top horn 32 and the bottom horn 34.

In one embodiment, as shown in FIG. 11, the baffle elements 82 to 89 curve in the horizontal direction. In other embodiments, one or more of the baffle elements 82 to 89 can also curve in the horizontal and vertical directions or only in the vertical direction. In other embodiments, one or more baffle elements 82 to 89 can be straight, stepped, irregular, among others, in the horizontal direction and/or vertical direction.

In one embodiment, the cross-fired horn system 30 comprises a pair of side mounting flange portions or sections 98, 100 (FIG. 11). The mounting flange sections 98, 100 facilitate the mounting of the cross-fired system 30. In other embodiments, mounting flanges can be provided above and below the cross-fired horn system 30, as required or desired, giving due consideration to the goal of facilitating the mounting of the cross-fired system 30.

In one embodiment, the baffling 40 is configured without one or both of the baffle elements 84, 88. In another embodiment, the baffling 40 is configured without one or more of the baffle elements 83, 85, 87, 89. In yet another embodiment, respective top and bottom caps or cap elements 85*a*, 89*a* are provided above and below respective sound expansion chambers 42, 62. In a further embodiment, the cross-fired horn loudspeaker 30 of the invention is configured without any baffling, caps and/or mounting flanges.

In other embodiments, baffle elements, cap elements, and/or mounting flanges can be provided in a desired or required combination and/or configuration to the sides, above, below or between the sound expansion chambers 42, 62 with efficacy, giving due consideration to the goals of preventing or mitigating undesirable diffraction and interaction between the sound waves or signals broadcasted from the top horn 32 and the bottom horn 34 and the cavities formed between the top horn 32 and the bottom horn 34 and/or facilitating the mounting of the cross-fired horn loudspeaker system 30.

Sound Chamber Configurations

FIG. 11 illustrates sound expansion chambers 42, 62 with respective bell sections 46, 66 and flange sections 48, 68 in accordance with one embodiment of the invention. The bell sections 46, 66 form generally flared sound transmitting passages and include a plurality of internal flared surfaces. In one embodiment, the sound expansion chambers 42, 62 are configured with bell sections 46, 66 only and no flange sections 48, 68. In another embodiment, one or both of the bell sections 46, 66 form sound transmitting passages with a single flared internal surface, for example, substantially conical or frusto-conical.

Referring again to FIG. 11, the flange sections 48, 68 form generally flared sound transmitting passages and include a plurality of internal flared surfaces. In one embodiment, the sound expansion chambers 42, 62 are configured with flange sections 48, 68 only and no bell sections. In another embodiment, one or both of the flange sections 48, 68 form sound transmitting passages with a single flared internal surface, for example, substantially conical or frusto-conical.

In other embodiments, the sound expansion chambers 42, 62 can be configured and dimensioned in a wide variety of manners with efficacy, as required or desired, giving due consideration to achieving one or more of the benefits and advantages as taught or suggested herein. In general, the sound chamber configuration typically takes into account such factors as the desired or required directivity response, frequency response, and/or other operational parameters.

Multi-Way System

Figure 12:
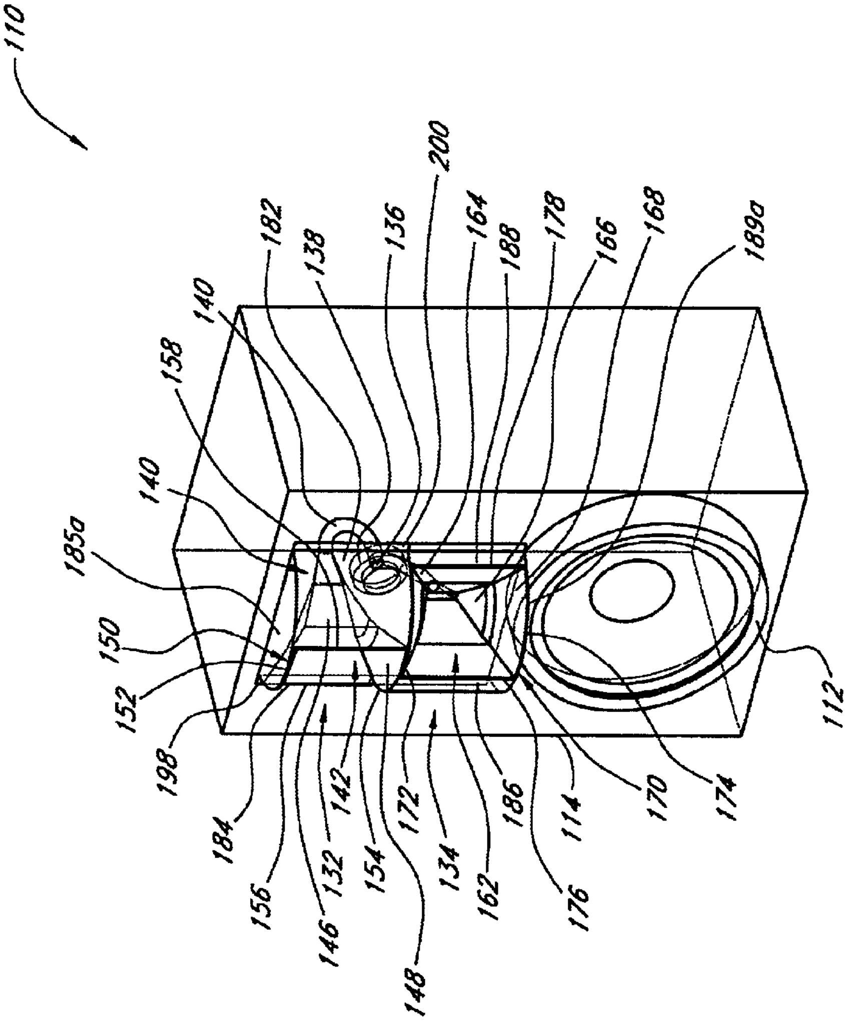
FIG. 12 is a schematic perspective view of a multi-way speaker system with a cross-fired horn system in accordance with one embodiment of the invention.

FIG. 12 is a schematic drawing of a multi-way speaker sound system 110 with a small format cross-fired horn system, assembly, combination or apparatus 130 and having features in accordance with one embodiment of the invention. The multi-way assembly 110 generally comprises the cross-fired horn system 130 and a woofer or low frequency sound source 112 housed or mounted in a speaker body, enclosure, support structure or frame 114. One advantage of the multi-way combination 110 is that it provides a mid and/or high frequency directivity response that is desirably wide in the horizontal direction and narrow in the vertical direction and an extended low frequency response.

The cross-fired horn system 130 generally comprises a pair of vertically displaced or offset horns, or horn elements/modules/sections 132, 134 with cross-fired aiming angles. In one embodiment, the horns 132, 134 are in acoustical communication with a common throat section or divider 136 connected to a compression driver unit or assembly 138.

In one embodiment, a baffle system or structure 140 is integrally formed or molded with the horns 132, 134. In other embodiments, the horns 132, 134 can be mounted or housed in the baffling 140. As the skilled artisan will realize, the enclosure 114, the baffling 140, and the horns 132, 134 can be coupled to one another utilizing a wide variety of techniques, for example, screws, nut-bolt combinations, rivets, clamps, adhesives, or combinations thereof, among others.

The upper first horn 132 comprises a sound expansion chamber 142 in acoustical communication with a throat 144 which in turn is in acoustical communication with the common throat section 136. The sound expansion chamber 142 includes a generally flared bell portion or section 146 and a generally flared flange portion or section 148 which forms a mouth 150 at the sound radiating end of the first horn 132. In one embodiment, the mouth 150 has substantially radial top and bottom edges 152, 154 in the horizontal plane, with generally straight side edges 156, 158 in the vertical plane, and a substantially rectangular cross-sectional shape in a projection on a plane normal to the outbound longitudinal axis (as defined above). In other embodiments, the horn mouth edges 152, 154, 156, and 158 may be shaped in a wide variety of manners, for example, curved, straight or irregular, among others, in both the horizontal and/or vertical planes, and the mouth cross-section may be shaped in a wide variety of manners, for example, rectangular, square, oval, round or irregular, among others, in a projection on a plane normal to the outbound longitudinal axis (as defined above).

The throat 144 is part of a sound transmitting passage originating at the common throat section 136 and terminating at the mouth 150. In one embodiment, the inner diameter, cross-section, or other appropriate area scale of the throat 144 generally increases in the direction commencing from the common throat section 136 and leading towards the sound expansion chamber 142. This increase in throat size can be generally steady, linear, exponential, irregular, stepped or non-linear, among other configurations.

The lower second horn 134 comprises a sound expansion chamber 162 in acoustical communication with a throat 164 which in turn is in acoustical communication with the common throat section 136. The sound expansion chamber 162 includes a generally flared bell portion or section 166 and a generally flared flange portion or section 168 which forms a mouth 170 at the sound radiating end of the second horn 134. In one embodiment, the mouth 170 has substantially radial top and bottom edges 172, 174 in the horizontal plane, with generally straight side edges 176, 178 in the vertical plane, and a substantially rectangular cross-sectional shape in a projection on a plane normal to the outbound longitudinal axis (as defined above). In other embodiments, the horn mouth edges 172, 174, 176, and 178 may be shaped in a wide variety of manners, for example, curved, straight or irregular, among others, in both the horizontal and/or vertical planes, and the mouth cross-section may be shaped in a wide variety of manners, for example, rectangular, square, oval, round or irregular, among others, in a projection on a plane normal to the outbound longitudinal axis (as defined above).

The throat 164 is part of a sound transmitting passage originating at the common throat section 136 and terminating at the mouth 170. In one embodiment, the inner diameter, cross-section, or other appropriate area scale of the throat 164 generally increases in the direction commencing from the common throat section 136 and leading towards the sound expansion chamber 162. This increase in throat size can be generally steady, linear, exponential, irregular, stepped or non-linear, among other configurations.

The horn sections 132 and 134 can be oriented in a wide variety of manners to provide a wide range of cross-fire angles (CFA) and vertical divergence/convergence angles (VDA), as required or desired, giving due consideration to the goals of achieving one or more of the benefits and advantages as taught or suggested herein.

In one embodiment, and as indicated above, a substantially asymmetric baffle system or structure 140 is integrally formed or molded with the horns sections 132, 134 to further improve the acoustic performance of the multi-way speaker system 110. This results in an integral unit comprising the sound expansion chambers 142, 162 and the baffling 140. The baffling 140 functions to substantially prevent or mitigate undesirable diffraction and interaction between the sound waves or signals broadcasted from the top horn 132 and the bottom horn 134 and the cavities formed between the top horn 132 and the bottom horn 134 and/or reflected or reradiated from the speaker body/enclosure or frame 114.

In one embodiment, the baffle system 140 is generally associated with the side edges of the top sound expansion chamber 142 near the mouth 150 and the bottom sound expansion chamber 162. In one embodiment, the baffling 140 is in mechanical communication with the sound expansion chambers 142, 162. The baffling 140 generally comprises baffle elements 182, 184, 186, 188. The baffle elements 182, 184 are associated with the top sound expansion chamber 142 with the baffle element 182 being substantially wider than the baffle element 184. Similarly, the baffle elements 186, 188 are associated with the bottom sound expansion chamber 162 with the baffle element 186 being substantially wider than the baffle element 188.

The substantially wide top baffle element 182 is positioned generally above and in mechanical communication with the substantially narrow bottom baffle element 188. The substantially narrow top baffle element 184 is positioned generally above and in mechanical communication with the substantially wide bottom baffle element 186. This configuration and dimensional contrast between the baffle elements 182, 184, 186, 188 gives rise to the desirable asymmetry of the baffling 140. In turn, this causes a further improvement in the acoustical performance of the multi-way speaker system 110 of the invention.

In one embodiment the baffle elements 182, 184, 186 and 188 curve in the horizontal direction. In other embodiments, one or more of the baffle elements can also curve in the horizontal and vertical directions or only in the vertical direction. In further embodiments, one or more baffle elements 182 to 188 can be straight, stepped, irregular, among others, in the horizontal direction and/or vertical direction.

In one embodiment, the cross-fired horn system 130 comprises a pair of side mounting flange portions or sections 198, 200 (FIG. 12). The mounting flange sections 198, 200 facilitate the mounting of the cross-fired system 130 to the speaker body, enclosure, support structure, or frame 114. In other embodiments, mounting flange sections can be provided above and below the cross-fired horn system 130, as required or desired, giving due consideration to the goal of facilitating the mounting of the cross-fired system 130.

In one embodiment, respective top and bottom caps or cap elements 185*a*, 189*a* are provided above and below respective sound expansion chambers 142, 162. In another embodiment, the cross-fired loudspeaker 130 of the invention is configured without any cap elements.

In other embodiments, baffle elements, cap elements, and/or mounting flange sections can be provided in a desired or required combination and/or configuration to the sides, above, below or between the sound expansion chambers 142, 162 with efficacy, giving due consideration to the goals of preventing or mitigating undesired diffraction and interaction between the sound waves or signals broadcasted from the top horn 132 and the bottom horn 134 and the cavities formed between the top horn 132 and bottom horn 134 and/or reflected or reradiated by the speaker body/enclosure 114 and/or facilitating the mounting of the cross-fired horn loudspeaker system 130.

Figure 13:
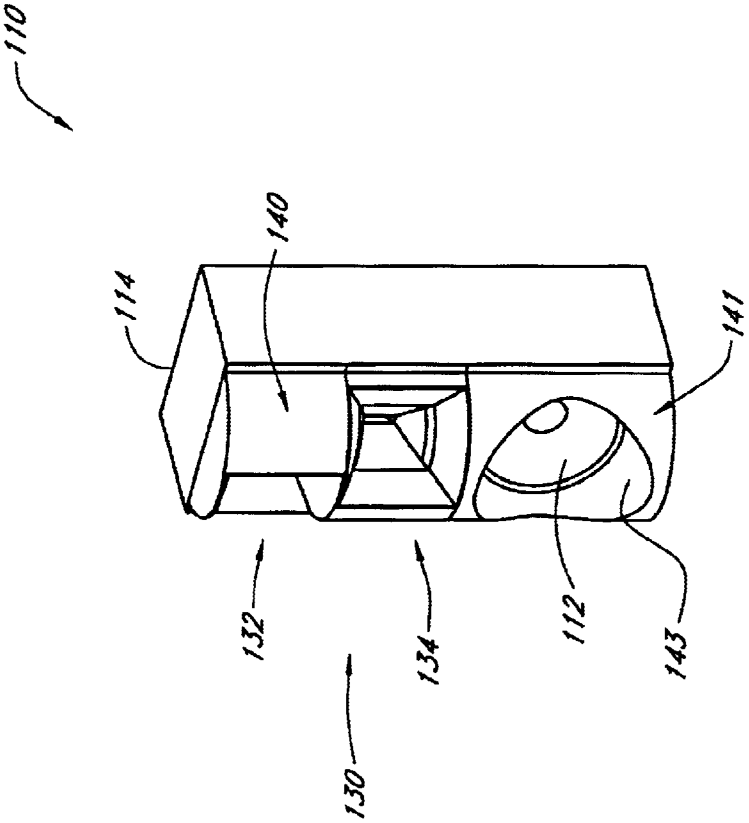
FIG. 13 is a schematic perspective view of a multi-way speaker system with a cross-fired horn system in accordance with another embodiment of the invention.

FIG. 13 is a schematic perspective view of a multi-way speaker system 110 with a large format cross-fired horn system, assembly, combination or apparatus 130 having features in accordance with one embodiment of the invention. The multi-way speaker system 110 generally comprises the cross-fired horn system 130 with a substantially asymmetric baffling 140 and a woofer 112 with a generally matching baffling 141 substantially circumscribing the woofer 112. The cross-fired horn system 130 generally comprises cross-fired horn sections 132, 134. The cross-fired horn system 130 and the woofer 112 are housed or mounted in a speaker enclosure or body 114. In one embodiment, the multi-way speaker system 110 comprises more than one or a plurality of woofers or low frequency sound sources.

Referring to FIG. 13, in one embodiment, the horn baffling 140 is substantially curved or radial in the horizontal direction and the woofer baffling 141 is substantially curved or radial in the horizontal direction. An internal surface 143 of the woofer baffling 141 generally fans out, flares, or provides for acoustical expansion. This further accentuates the performance of the woofer 112, and hence that of the multi-way speaker system 110. In one embodiment, the horn baffling 140 and the woofer baffling 141 are separate units.

The generally matching woofer baffling 141 functions to substantially prevent or mitigate undesirable diffraction and interaction between the sound waves or signals broadcasted from the cross-fired horn system 130 and those reflected by the speaker body 114 and/or broadcasted from the woofer 112. In other embodiments, the woofer baffling 141 can be configured and dimensioned in a wide variety of manners with efficacy, as required or desired, giving due consideration to the goal of achieving one or more of the benefits and advantages as taught or suggested herein.

Figure 14:
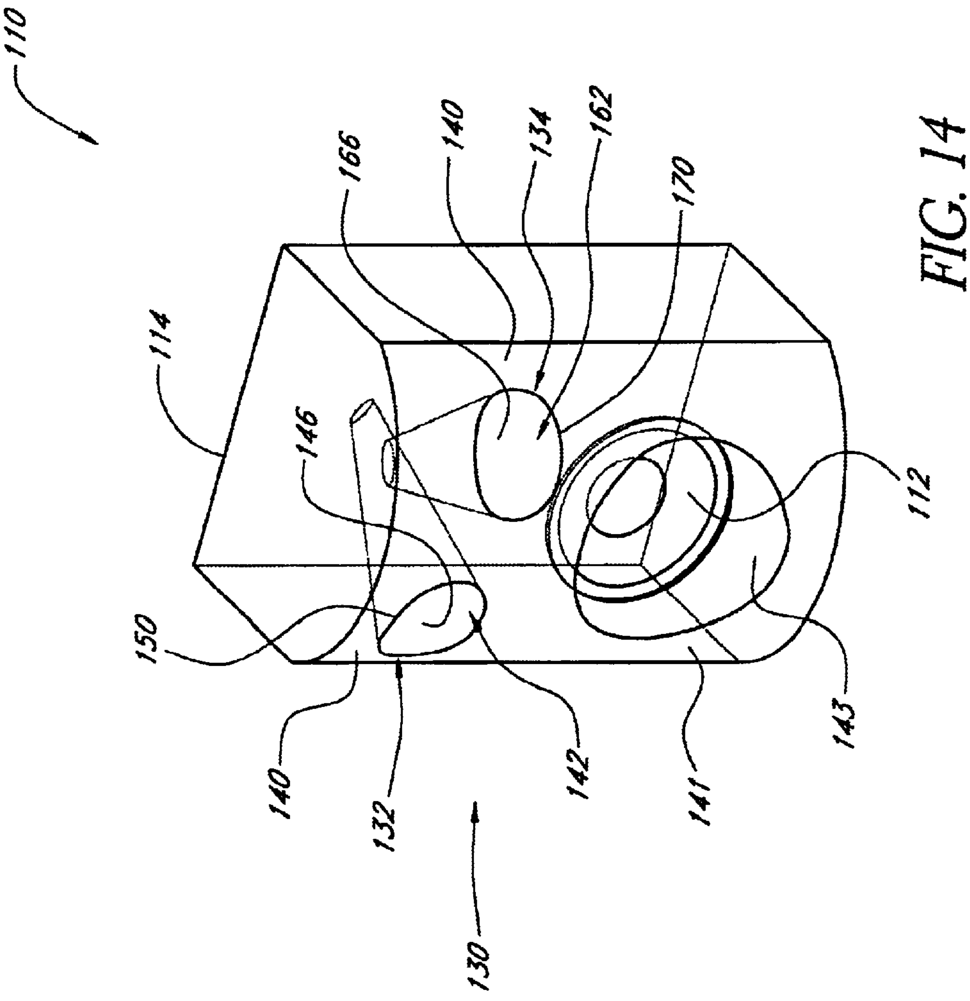
FIG. 14 is a schematic perspective view of a multi-way speaker system with a cross-fired horn system in accordance with yet another embodiment of the invention.

FIG. 14 is a schematic perspective view of a multi-way speaker system 110 having a cross-fired horn system 130 and a woofer 112 in accordance with yet another embodiment of the invention. The cross-fired horn system 130 generally comprises cross-fired horn sections 132, 134. In this embodiment, a fully integrated multi-way system 110 is provided with the horn sound expansion chambers 142, 162, the horn baffling 140, and the woofer baffling 141 being formed as an integral unit, for example, by injection molding. In one embodiment, a speaker enclosure 114 is integrally formed into the multi-way system 110.

Referring to FIG. 14, in one embodiment, the horn baffling 140 is substantially curved or radial in the horizontal direction and the woofer baffling 141 is substantially curved or radial in the horizontal direction. An internal surface 143 of the woofer baffling 141 generally fans out, flares, or provides for acoustical expansion and substantially circumscribes the woofer 112. This further accentuates the performance of the woofer 112, and hence that of the multi-way speaker system 110. In one embodiment, the integrated multi-way speaker system 110 comprises more than one or a plurality of woofers.

The embodiment of FIG. 14 also illustrates generally round or oval shaped horn mouths 150, 170. Additionally, the bell sections 146, 166 of the respective sound expansion chambers 142, 162 each comprise a single generally flared internal surface. Further, sound expansion chambers 142, 162 have no flange sections. In other embodiments, and as discussed above, the mouths 150, 170 and/or the sound expansion chambers 142, 162 can be configured in a wide variety of manners.

Asymmetric Horn Element

Figure 15:
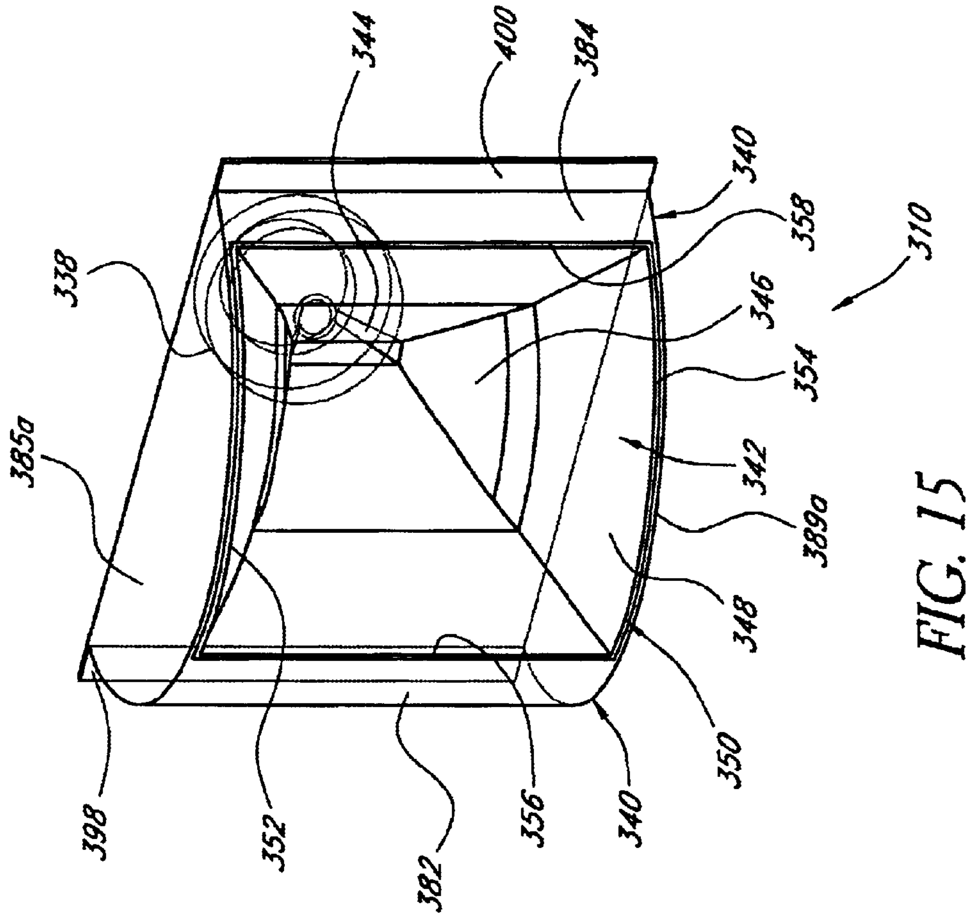
FIG. 15 is a schematic perspective view of an asymmetric horn element in accordance with one embodiment of the invention.
Figure 16:
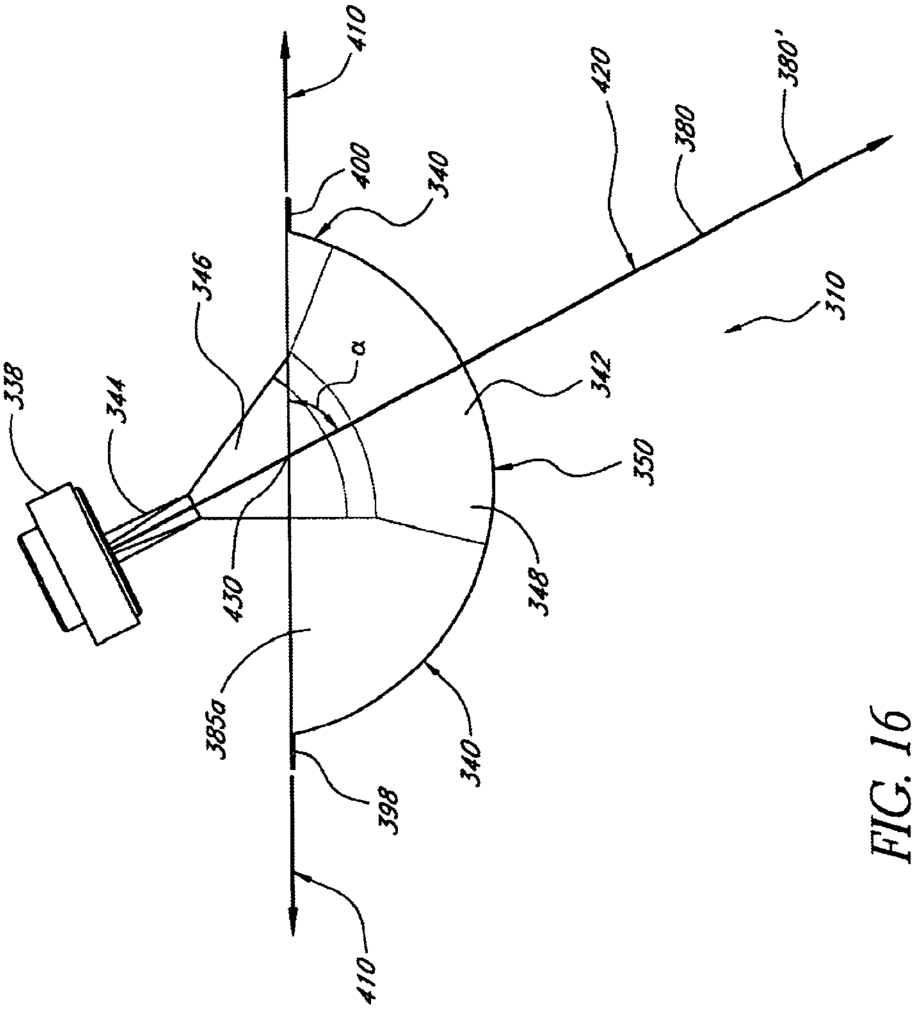
FIG. 16 is a schematic top plan view of the asymmetric horn element of FIG. 15 illustrating the orientation of the horn element longitudinal plane with respect to the reference plane.
Figure 17:
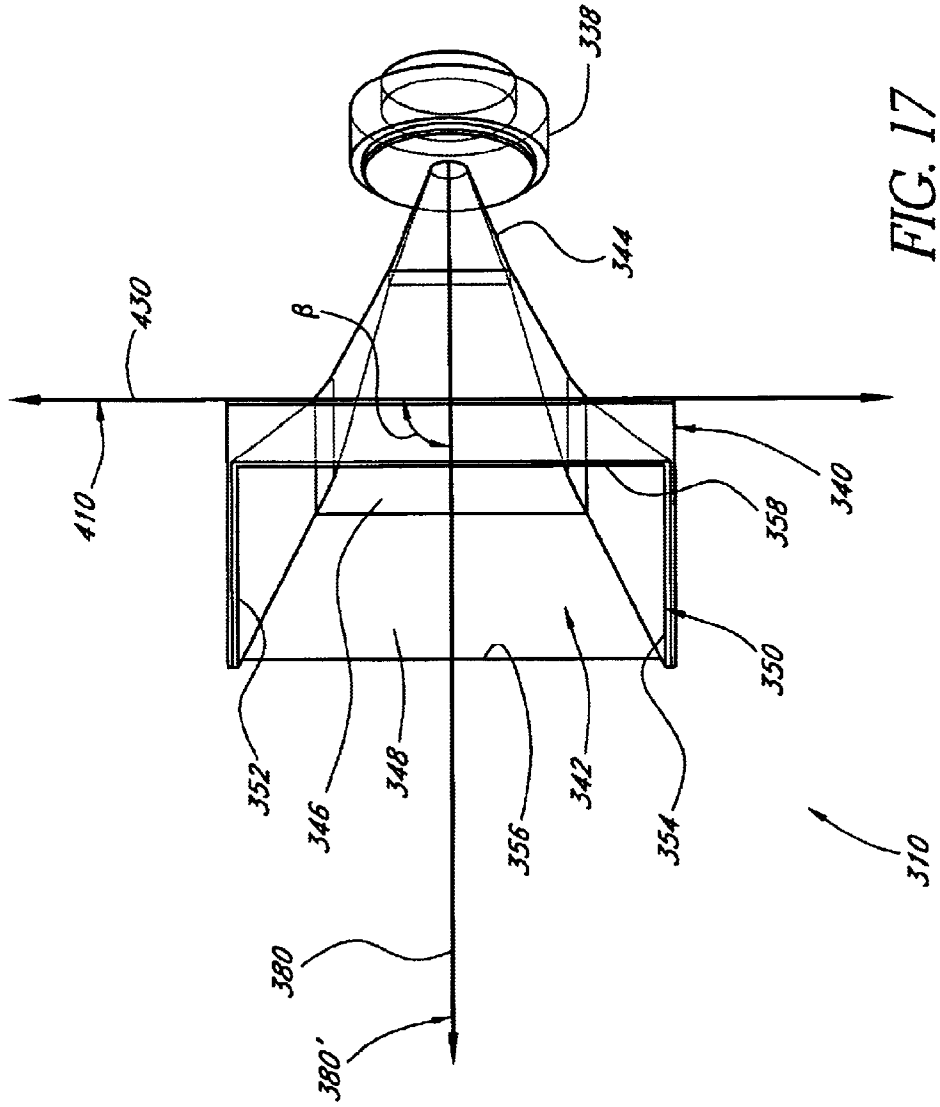
FIG. 17 is a schematic side elevation view of the asymmetric horn element of FIG. 15.
Figure 18:
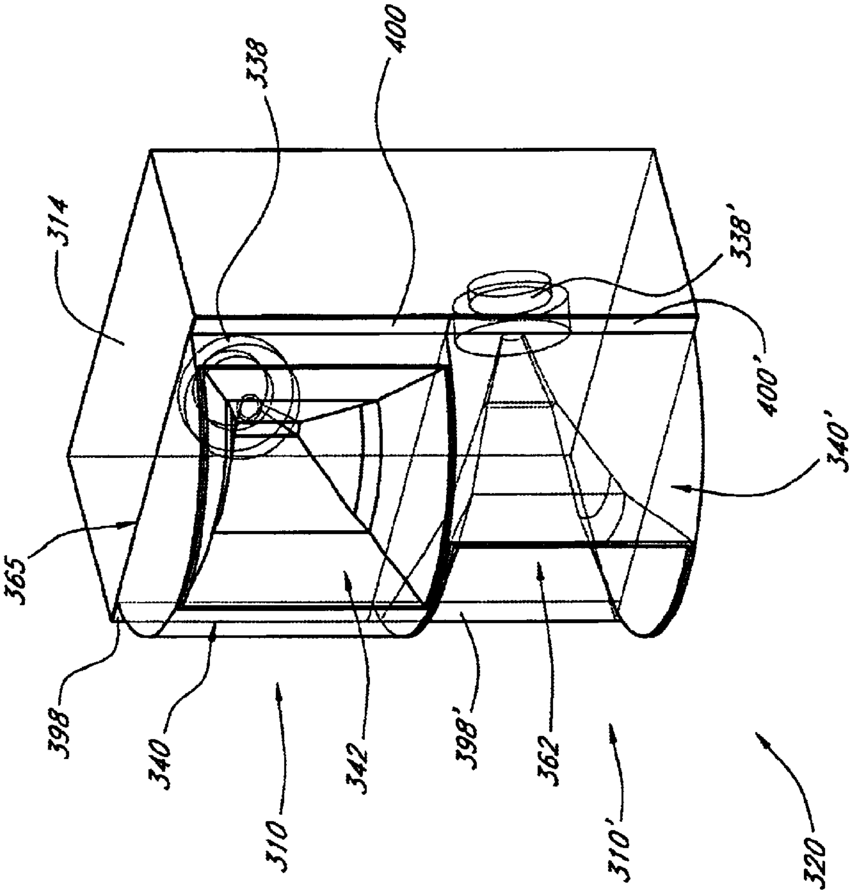
FIG. 18 is a schematic perspective view of a stack of asymmetric horn elements in accordance with one embodiment of the invention.

FIGS. 15 to 17 show perspective, top and side views of an asymmetric horn element, section or module 310 and having features in accordance with one embodiment of the invention. The asymmetric horn element 310 generally comprises a sound expansion chamber 342 with an asymmetric aiming angle and a means for aligning/mounting/combining a second vertically displaced asymmetric horn element in a manner to provide a cross-fire angle between them. In one embodiment, as discussed in greater detail later herein, a reference plane 410 (FIG. 16) is specified at a predetermined angle with regard to the nominal dispersion angle of the asymmetric horn element 310 and the required or desired degree of crossfire of a vertical stack of asymmetric horn elements. FIG. 18 shows a perspective view of an asymmetric horn element stack generally comprising two asymmetric horn elements, with coincident reference planes, one inverted and vertically displaced, and providing a cross-fire angle between them. Two or more asymmetric horn elements arranged, for example, in a vertical stack with a cross-fired orientation provide a desirably wide horizontal directivity response and a narrow vertical directivity response.

In one embodiment, as discussed in greater detail later herein, mounting flange sections 398, 400 are integrally formed or molded with the asymmetric horn element 310 and are coincident with the reference plane 410. This provides for the alignment/mounting/combining of two asymmetric horn elements, one inverted and vertically displaced, and achieves the desired crossfire angle between them. In a further embodiment, the mounting flange sections 398, 400 are parallel to and displaced from the reference plane 410.

In another embodiment, the asymmetric horn element 310 is housed in an enclosure, box, support structure or frame 314 (FIG. 18) whose mounting surface 365 is coincident with the reference plane 410. This provides for the aligning/mounting/arranging of two asymmetric horn elements, one inverted and vertically displaced, and achieves the desired crossfire angle between them. In yet a further embodiment, the mounting surface 365 of the enclosure/box/support structure or frame 314 is parallel to and displaced from the reference plane 410.

In a further embodiment, as discussed in greater detail later herein, a baffle system or structure 340 is integrally formed or molded with the asymmetric horn element 310. This further improves the acoustical performance. In other embodiments, the asymmetric horn element 310 can be mounted or housed in the baffling 340.

The asymmetric horn element 310 comprises the sound expansion chamber 342 in acoustical communication with a throat 344 which in turn is connected to a compression driver unit or assembly 338. The sound expansion chamber 342 includes a bell portion or section 346 and a flange portion or section 348 which forms a mouth 350 at the sound radiating end of the horn element 310.

The bell section 346 is positioned intermediate the throat 344 and the flange section 348. In one embodiment, the bell section 346 forms a generally flared sound transmitting passage and includes a plurality of flared internal surfaces. The direction of the flare is towards the horn mouth 350. In one embodiment, the flange section 348 forms a generally flared sound transmitting passage and includes a plurality of flared internal surfaces. The direction of the flare is towards the horn mouth 350.

In one embodiment, the mouth 350 has substantially radial top and bottom edges 352, 354 in the horizontal plane, with generally straight side edges 356, 358 in the vertical plane, and a substantially rectangular cross-sectional shape in a projection on a plane normal to the outbound longitudinal axis 380 (defined again later herein). In other embodiments, the horn element mouth edges 352, 354, 356, 358 may be shaped in a wide variety of manners, for example, curved, straight or irregular, among others, in both the horizontal and/or vertical planes, and the mouth cross-section may be shaped in a wide variety of manners, for example, rectangular, square, oval, round or irregular, among others, in a projection on a plane normal to the outbound longitudinal axis 380 (defined again later herein).

The throat 344 is part of a sound transmitting passage originating at the driver 338 and terminating at the mouth 350. The throat 344 can be coupled to the sound expansion chamber 342 in a wide variety of manners, for example, by utilizing suitable mounting flanges, fittings, connectors, couplings, and the like, giving due consideration to the goal of providing acoustical communication between the throat 344 and the sound expansion chamber 342. In other embodiments, the throat 344 is in a continuous transition with the sound expansion chamber 342 to form an integral unit.

In one embodiment, the inner diameter, cross-section, or other appropriate area scale of the throat 344 generally increases in the direction commencing from the driver 338 and leading towards the sound expansion chamber 342. This increase in throat size can be generally steady, linear, exponential, irregular, stepped or non-linear, among other configurations.

The driver unit 338 comprises one or more compression drivers and is coupled to the throat 344. The driver 338 serves as a transducer to convert and/or transform electrical signals or energy into sound waves, signals, or energy. Any one of a number of commercially available compression drivers may be utilized with the asymmetric horn element 310 of the invention, giving due consideration to the goal of achieving one or more of the benefits and advantages as taught or suggested herein.

FIG. 16 (top view) shows the longitudinal axis or centerline 380' of the asymmetric horn element 310. The longitudinal axis or centerline 380' originates at the driver 338, travels through, continues or spans the throat 344 and sound expansion chamber 342, and extends outbound through the mouth 350.

The "outbound" longitudinal axis or centerline 380 comprises a segment of the longitudinal axis 380' originating at or near the junction of the sound expansion chamber 342 and throat 344 and extending outbound through the horn mouth 350, or a substantially straight segment of the longitudinal axis 380' extending outbound through the horn mouth 350. The vertical longitudinal plane 420 is a vertical plane through the outbound longitudinal axis or centerline 380.

In one embodiment, the reference plane 410 is oriented with respect to the vertical longitudinal plane 420 by a predetermined horizontal asymmetry angle α (in degrees) given by the expression:

$$\alpha = 90 - \frac{NDA_H}{K} \tag{4}$$

where $NDA_H$ is the nominal dispersion angle in the horizontal plane as defined above herein and K is a parameter that defines the degree of horizontal asymmetry. The horn element 310 is said to be "horizontally asymmetric" when the reference plane 410 is not orthogonal to the vertical longitudinal plane 420. Stated differently, the horn element 310 is said to be "horizontally asymmetric" when the angle between the reference plane 410 and the vertical longitudinal plane 420 is not equal to 90°.

FIG. 17 (side view), also illustrates the longitudinal axis or centerline 380' of the asymmetric horn element 310. The vertical reference axis 430 is a vertical axis at or through the intersection of the vertical longitudinal plane 420 and the reference plane 410. In one embodiment, the vertical reference axis 430 and hence the reference plane 410 is oriented with respect to the outbound longitudinal axis 380 by a predetermined vertical asymmetry angle β (in degrees) given by the expression:

$$\beta = 90 - \frac{NDA_V}{C} \tag{5}$$

where $NDA_V$ is the nominal dispersion angle in the vertical plane as defined above herein and C is a parameter that defines the degree of vertical asymmetry. The horn element 310 is said to be "vertically asymmetric" when the vertical reference axis 430 is not orthogonal to the outbound longitudinal axis 380. Stated differently, the horn element 310 is said to be "vertically asymmetric" when the angle between the vertical reference axis 430 and the outbound longitudinal axis 380 is not equal to 90°. In another embodiment, β=90°, and the horn element 310 can be said to be "vertically normal or orthogonal" as shown in FIG. 17.

Referring to FIGS. 15 to 17, in one embodiment, a substantially asymmetric baffle system or structure 340 is integrally formed or molded with the asymmetric horn element 310 to further improve the acoustical performance. The baffling 340 functions to substantially prevent or mitigate undesirable diffraction of the sound waves broadcasted from the asymmetric horn element mouth 350.

In one embodiment, the baffle system 340 is generally associated with the side edges of the sound expansion chamber 342 near the mouth 350. In one embodiment, the baffling 340 is in mechanical communication with the sound expansion chamber 342. The baffling 340 generally comprises baffle elements 382, 384. The baffle elements 382, 384 are associated with the side edges of the sound expansion chamber 342 near the mouth 350 with the baffle element 382 being substantially wider than the baffle element 384.

In other embodiments, the baffle system 340 can be configured and dimensioned in a wide variety of manners with efficacy, as required or desired, giving due consideration to the goal of achieving one or more of the benefits and advantages as taught or suggested herein. Respective baffle elements can also be provided above and below the top and/or bottom edges of the sound expansion chamber 342 near the mouth 350, giving due consideration to the goal of further enhancing the acoustical performance of the asymmetric horn element 310 of the invention.

In one embodiment, the baffle system 340 is in mechanical communication with the sound expansion chamber 340. In another embodiment, the baffle system 340 is autonomous from the sound expansion chamber 342. As the skilled artisan will realize, the baffling 340 can be coupled to the sound expansion chamber 342 utilizing a wide variety of techniques, for example, screws, nut-bolt combinations, rivets, clamps, adhesives, or combinations thereof, among others.

In one embodiment, the sound expansion chamber 342 and the baffling 340 are formed by an injection molding process. This results in an integral unit comprising the sound expansion chamber 342 and baffling 340.

In another embodiment, the sound expansion chamber 342, the throat 344, and the baffling 340 are formed by an injection molding process to form an integral unit. In other embodiments, as the skilled artisan will realize, the asymmetric horn element 310 of the invention can be fabricated in a wide variety of manners, for example, utilizing machining, forging, casting, or combinations thereof, among others.

The throat 344 is coupled to sound expansion chamber 342 and the compression driver or unit 338. This completes the assembly and formation of the asymmetric horn element 310.

The sound expansion chamber 342 is preferably fabricated from a substantially non-resonant, structural material. For example, in one embodiment, the sound expansion chamber 342 is fabricated from a fiberglass material. In another embodiment, the sound expansion chamber 342 is fabricated from a polyester material. In other embodiments, the sound expansion chamber 342 can be fabricated from a wide variety of materials.

The baffling 340 is preferably fabricated from a substantially non-resonant, structural material. For example, in one embodiment, the baffling 340 is fabricated from a fiberglass material. In another embodiment, the baffling 340 is fabricated from a polyester material. In other embodiments, the baffling 340 can be fabricated from a wide variety of materials.

The throat 344 is preferably fabricated from a substantially non-resonant, structural material. For example, in one embodiment, the throat 344 is fabricated from a fiberglass material. In another embodiment, the throat 344 is fabricated from a polyester material. In a further embodiment, the throat 344 is fabricated from a metal, for example, by metal casting. In other embodiments, the throat 344 can be fabricated from a wide variety of materials.

Throat Configurations

Referring again to FIGS. 15 to 17, the throat 344 couples the sound expansion chamber 342 with the compression driver or unit 338. In one embodiment, the throat 344 is generally straight. In other embodiments, the throat 344 may bend in the horizontal direction and/or the vertical direction. In yet other embodiments, the throat 344 may have a plurality of bends in the horizontal and/or vertical directions. In other embodiments, the throat 344 can be configured and dimensioned in a wide variety of manners with efficacy, as required or desired, giving due consideration to achieving one or more of the benefits and advantages as taught or suggested herein. In general, the throat configuration typically takes into account such factors as the desired or required frequency response and/or other operational parameters or physical constraints.

Baffle Configurations

Referring again to FIG. 15, the baffle system 340 is generally associated with the side edges of the sound expansion chamber 342 near the mouth 350. The baffling 340 is substantially asymmetric and comprises baffle elements 382 and 384. In one embodiment, the baffle elements 382, 384 curve in the horizontal direction. In other embodiments, one or both of the baffle elements 382, 384 can curve in the horizontal and vertical directions or only in the vertical direction. In further embodiments, one or more baffle elements can be straight, stepped, or irregular, among others, in the horizontal direction and/or vertical direction.

The baffle elements 382, 384 are associated with the side edges of the sound expansion chamber 342 near the mouth 350 with the baffle element 382 being substantially wider than baffle element 384. In one embodiment, the baffling 340 is configured without one or both of the baffle elements 382, 384. In another embodiment, respective baffle elements are provided above and below the top and/or bottom edges of the sound expansion chamber 342 near the mouth 350.

In one embodiment, and referring in particular to FIG. 15, respective top and bottom caps or cap elements 385*a*, 389*a* are provided above and below the sound expansion chamber 342.

In other embodiments, the baffle elements and/or cap elements can be provided in a desired or required combination and/or configuration to the sides, top and bottom of the sound expansion chamber 342 with efficacy, giving due consideration to the goals of preventing or mitigating undesirable diffraction of the sound waves broadcasted from the asymmetric horn element mouth 350.

Mounting Flange Configurations

Referring again to FIGS. 15 to 16, in one embodiment, the asymmetric horn element comprises a pair of side mounting flange sections 398, 400. The flange sections 398, 400 provide for the aligning/mounting/combining of the asymmetric horn element 310. In other embodiments, mounting flanges can be provided above and below the asymmetric horn element 310, as required or desired, giving due consideration to the goal of providing for the aligning/mounting/combining of the asymmetric horn element 310.

In one embodiment, the side mounting flange sections 398, 400 are coincident with the reference plane 410. In another embodiment, the side mounting flange section 398, 400 are coincident with a plane parallel to the reference plane 410, giving due consideration to the goal of aligning/mounting/combining two asymmetric horn elements, one inverted and vertically displaced, to provide a cross-fire angle between them. Two or more asymmetric horn elements arranged, for example, in a vertical stack and with a crossfired orientation provide a desirably wide horizontal directivity response and a narrow vertical directivity response.

Sound Chamber Configurations

Referring again to FIGS. 15 to 17, the sound expansion chamber 342 is comprised of a bell section 346 and a flange section 348, in accordance with one embodiment of the invention. The bell section 346 forms a generally flared sound transmitting passage and includes a plurality of internal flared surfaces. The flange section 348 forms a generally flared sound transmitting passage and includes a plurality of internal flared surfaces. In one embodiment, the sound expansion chamber 342 is configured with a bell section 346 only and no flange section. In another embodiment, the sound chamber is configured with a flange section 348 only and no bell section. In yet another embodiment, one or both of the bell and flange sections 346, 348 form sound transmitting passages with a single flared internal surface, for example, substantially conical or frusto-conical shaped.

In other embodiments, the sound expansion chamber 342 can be configured and dimensioned in a wide variety of manners with efficacy, as required or desired, giving due consideration to achieving one or more of the benefits and advantages as taught or suggested herein. In general, the sound chamber configuration typically takes into account such factors as the desired or required directivity response and/or other operational parameters.

Asymmetric Horn Element Stack

Figure 19:
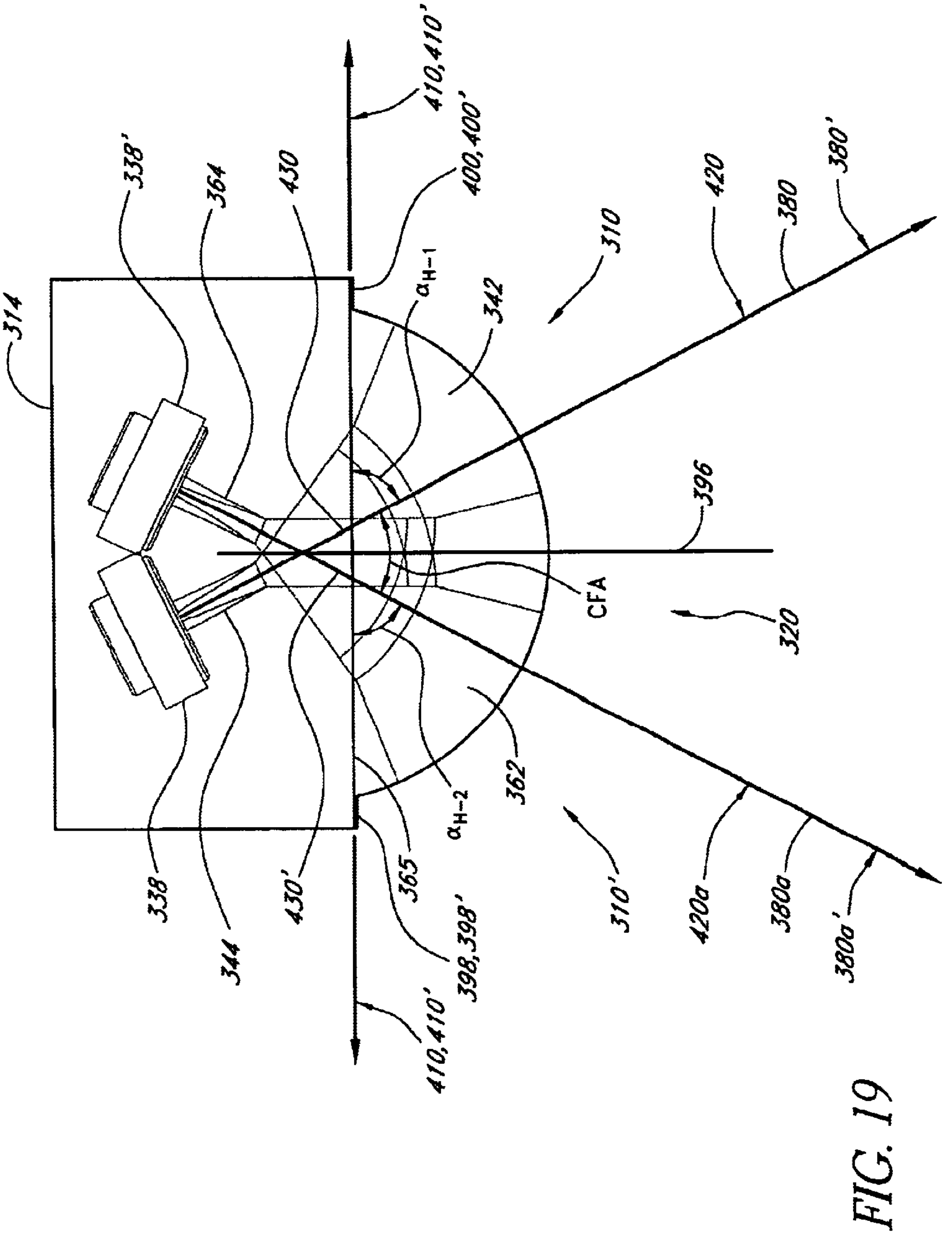
FIG. 19 is a schematic top plan view of the stack of asymmetric horn elements of FIG. 18.
Figure 20:
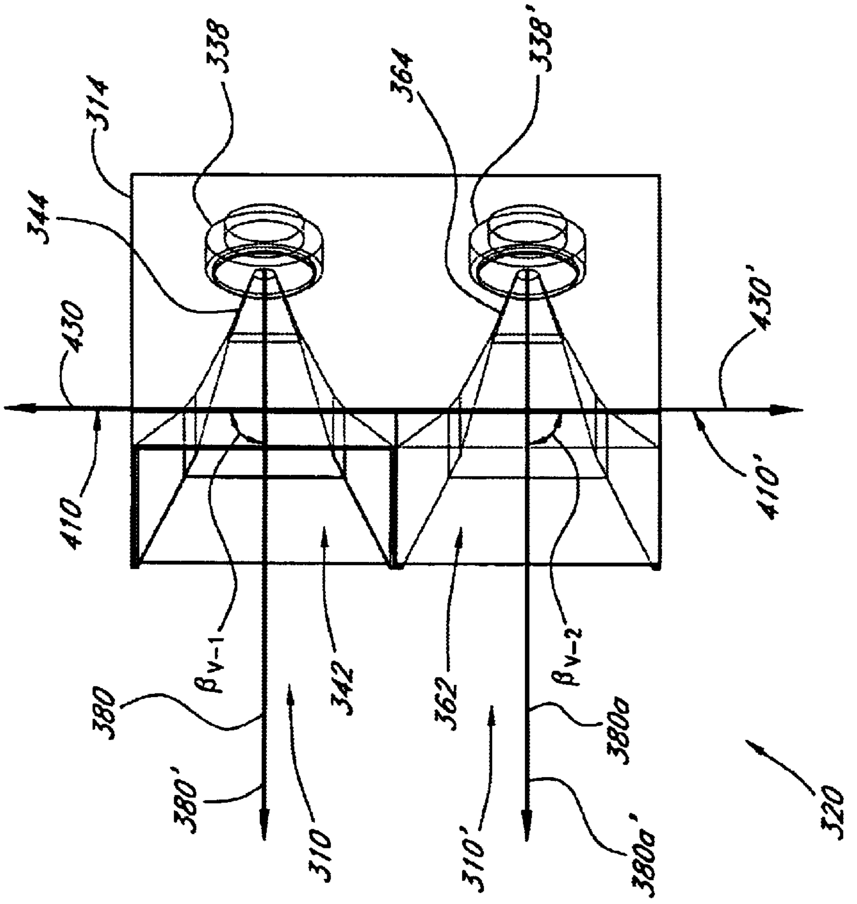
FIG. 20 is a schematic side elevation view of the stack of asymmetric horn elements of FIG. 18.

FIGS. 18 through 20 show perspective, top, and side views of a stack, system, assembly or combination 320 comprising two asymmetric horn elements 310, 310' housed in an enclosure, box, support structure or frame 314 and having features in accordance with one embodiment of the invention. The stack 320 includes respective asymmetric horn elements 310, 310' aligned/mounted/combined with coincident reference planes 410, 410', one inverted and vertically displaced, and providing a crossfire angle between them. The asymmetry refers to the off-axis orientation of the sound expansion chambers 342, 362 with respect to their respective reference planes 410, 410'. One advantage of the asymmetric horn element stack 320 is that it provides a desirably wide horizontal directivity response and a narrow vertical directivity response.

Two or more asymmetric horn elements can be stacked, vertically displaced and providing a crossfire angle, as required or desired, giving due consideration to the goal of achieving one or more of the benefits and advantages as taught or suggested herein. The structure of the asymmetric horn element 310 has been described above, and the basic structure of the second asymmetric horn element 310' is of a generally similar nature. The asymmetric horn elements 310, 310' include respective sound expansion chambers 342, 362 in acoustical communication with respective throats 344, 364 which in turn are connected to respective compression drivers 338, 338'.

In one embodiment, the sound expansion chambers 342, 362 and throats 344, 364 of the respective asymmetric horn elements 310, 310' are configured and/or dimensioned substantially identically. In another embodiment, the sound expansion chambers 342, 362 and throats 344, 364 comprise different dimensions.

As shown in FIG. 19, the horn elements 310, 310' have respective longitudinal axes or centerlines 380', 380*a'* and respective outbound longitudinal axes 380, 380*a*. The cross-fire angle (CFA) between the two asymmetric horn elements 310, 310' and/or sound expansion chambers 342, 362 is the angle between the projections of the outbound longitudinal axes 380, 380*a* on a common horizontal plane and hence is a measure of angular offset or angulation. The bisecting vertical plane 396 is a vertical plane along a line that bisects the projections of the outbound longitudinal axes 380 on a common horizontal plane.

The vertical divergence/convergence angle (VDA) is the angle between the projections of the outbound longitudinal axes 380, 380*a* on the vertical bisecting plane 396, and hence is a measure of angular offset or angulation. The asymmetric horn elements 310, 310' can be oriented in a wide variety of manners to provide a wide range of cross-fire angles (CFA) and vertical divergence/convergence angles (VDA), as required or desired, giving due consideration to the goals of achieving one or more of the benefits and advantages as taught or suggested herein.

FIG. 18 is a perspective view of an asymmetric horn element stack 320 generally comprising two asymmetric horn elements 310, 310' and having features in accordance with one embodiment of the invention. The stack 320 is formed with autonomous respective upper and lower asymmetric horn elements 310, 310'. In another embodiment, the upper and lower asymmetric horn elements 310, 310' can be integrally formed to provide an integral unit or stack 320.

In one embodiment, a baffle system 340 or structure is integrally formed or molded with the upper asymmetric horn element 310. This further improves the acoustic performance of the asymmetric horn element stack 320. In other embodiments, the asymmetric horn element 310 can be mounted or housed in the baffling 340. As the skilled artisan will realize, the asymmetric horn element 310 can be coupled to the baffling 340 utilizing a wide variety of techniques, for example, screws, nut-bolt combinations, rivets, clamps, adhesives, or combinations thereof, among others.

In one embodiment, a baffle system or structure 340' is integrally formed or molded with the lower asymmetric horn element 310'. This further improves the acoustic performance of the asymmetric horn element stack 320. In other embodiments, the asymmetric horn element 310' can be mounted or housed in the baffling 340'. As the skilled artisan will realize, the asymmetric horn element 310' can be coupled to the baffling 340' utilizing a wide variety of techniques, for example, screws, nut-bolt combinations, rivets, clamps, adhesives, or combinations thereof, among others.

As illustrated in FIG. 19 (top view), the vertical longitudinal plane 420 of the upper asymmetric horn element 310 is a vertical plane through the outbound longitudinal axis 380. The vertical longitudinal plane 420 intersects a continuous reference plane 410 at an angle not equal to 90°. The upper horn element asymmetry is a consequence of the vertical longitudinal plane 420 not being orthogonal to the reference plane 410, that is, at an angle not equal to 90°.

Referring again to FIG. 19, the vertical longitudinal plane 420*a* of the lower asymmetric horn element 310' is a vertical plane through the outbound longitudinal axis 380*a*. The vertical longitudinal plane 420*a* intersects a second continuous reference plane 410' at an angle not equal to 90°. The lower horn element asymmetry is a consequence of the vertical longitudinal plane 420*a* not being orthogonal to the reference plane 410', that is, at an angle not equal to 90°. In one embodiment, the reference planes 410, 410' associated with the upper and lower asymmetric horn elements 310, 310' are coincident. In another embodiment, the reference planes 410, 410' are displaced from each other and parallel.

As illustrated in FIG. 19, the reference plane 410 of the upper asymmetric horn element 310 intersects the vertical longitudinal plane 420 at an angle given by the following relation:

$$\alpha_{H-1} = 90 - \frac{NDA_{H-1}}{K} \tag{6}$$

where, $\alpha_{H-1}$ is the horizontal asymmetry angle of the upper asymmetric horn element 310, $NDA_{H-1}$ is the nominal horizontal dispersion angle and K is a parameter that defines the degree of cross-fire of the asymmetric horn element stack 320.

As further illustrated in FIG. 19, the reference plane 410' of the lower asymmetric horn element 310' intersects the vertical longitudinal plane 420*a* at an angle given by the following relation:

$$\alpha_{H-2} = 90 - \frac{NDA_{H-2}}{K} \tag{7}$$

where, $\alpha_{H-2}$ is the horizontal asymmetry angle of the lower asymmetric horn element 310', $NDA_{H-2}$ is the nominal horizontal dispersion angle and K is a parameter that defines the degree of cross-fire of the asymmetric horn element stack 320.

Equation or expression (8) permits two asymmetric horn elements 310, 310', vertically displaced and with parallel reference planes 410, 410', one inverted with respect to the other, to provide a predetermined cross-fire angle CFA given by:

$$CFA = 180 - \alpha_{H-1} - \alpha_{H-2} \tag{8}$$

where $\alpha_{H-1}$ refers to the angle between the reference plane 410 of the upper asymmetric horn element 310 and the vertical longitudinal plane 420 and $\alpha_{H-2}$ refers to the angle between the reference plane 410' of the lower asymmetric horn element 310' and the vertical longitudinal plane 420*a*.

In one embodiment, K=2, and the cross-fire angle CFA is the average of the nominal horizontal dispersion angles of the two asymmetric horn elements 310, 310'. In another embodiment, $1<K\leqq 4$. In a further embodiment $1.5\leqq K\leqq 3$. In other embodiments, K can be selected, as required or desired, to achieve a cross-fire angle in the range from $0° < CFA < 180°$.

As illustrated in FIGS. 19 and 20, the vertical reference axis 430 of the upper horn element 310 is a vertical axis located coincident with the intersection of the vertical longitudinal plane 420 and the reference plane 410. The vertical reference axis 430' of the lower horn element 310' is a vertical axis located along the intersection of the vertical longitudinal plane 420' and the reference plane 410'.

As illustrated by FIG. 20 (side view), the vertical reference axis 430 and hence the reference plane 410 is oriented with respect to the outbound longitudinal axis 380 by a predetermined vertical asymmetry angle $\beta_{V-1}$ (in degrees) given by the expression:

$$\beta_{V-1} = 90 - \frac{NDA_{V-1}}{C} \tag{9}$$

where, $\beta_{V-1}$ is the vertical asymmetry angle of the upper asymmetric horn element 310, $NDA_{V-1}$ is the nominal vertical dispersion angle of the upper asymmetric horn element 310, and C is a parameter that defines the degree of vertical divergence/convergence of the asymmetrical horn element stack 320.

As further illustrated by FIG. 20, the vertical reference axis 430' and hence the reference plane 410' is oriented with respect to the outbound longitudinal axis 380*a* by a predetermined vertical asymmetry angle $\beta_{V-2}$ (in degrees) given by the expression:

$$\beta_{V-2} = 90 - \frac{NDA_{V-2}}{C} \tag{10}$$

where, $\beta_{V-2}$ is the vertical asymmetry angle of the lower asymmetric horn element 310', $NDA_{V-2}$ is the nominal vertical dispersion angle of the lower asymmetric horn element 310', and C is a parameter that defines the degree of vertical divergence/convergence of the asymmetrical horn element stack 320.

Equation (11) permits two asymmetric horn elements 310, 310', vertically displaced and with parallel reference planes 410, 410', one inverted and displaced with respect to the other, to provide a predetermined vertical divergence/convergence angle given by:

$$VDA=180-\beta_{V-1}-\beta_{V-2} \quad (11)$$

where $\beta_{V-1}$ refers to the angle between the vertical reference axis 430 of the upper asymmetric horn element 310 and the outbound longitudinal axis 380 and $\beta_{V-2}$ refers to the angle between the vertical reference axis 430' of the lower asymmetric horn element 310' and the outbound longitudinal axis 380*a*.

In one embodiment, C=±∞, and hence VDA=0° so that the horn elements 310, 310' are vertically parallel as shown in FIG. 20. Note that divergence is indicated by VDA>0° and convergence is indicated by VDA<0°, as discussed above. In one vertically divergent embodiment, 3≦C<∞. In another vertically divergent embodiment, 1.3≦C<3. In yet another vertically divergent embodiment, 0.10≦C<1.3. In one vertically convergent embodiment, −∞<C≦−3. In another vertically convergent embodiment, −3<C≦−1.3. In yet another vertically convergent embodiment, −1.3<C≦−0.10. In other embodiments, C can be selected, as required or desired, to achieve a vertical divergence/convergence angle in the range from −180° to 180°, that is, −180°≦VDA≦180°.

The horizontal asymmetry angles, the cross-fire angles, the vertical asymmetry angles, and/or the vertical divergence/convergence angles can be selected in a wide variety of manners with efficacy, as required or desired, giving due consideration to the goal of achieving one or more of the benefits and advantages as taught or suggested herein. This adds to the versatility of the invention, for example in the choice of coverage angles, among others.

Asymmetric Horn Element Stack Overlap Configurations

The asymmetric horn element stack 320 can be embodied with a plurality of cross-fired configurations. As defined above, the cross-fire angle (CFA) is the angle between the projections of the outbound longitudinal axes 380, 380*a* on a common horizontal plane and hence is a measure of angular offset or angulation. It is also convenient to define an "overlap area" as the area of overlap between the projections of the sound chambers of a pair of asymmetric horn elements, one inverted and vertically displaced onto a common horizontal plane. Thus, when there is a finite "overlap area" the asymmetric horn elements can be referred to as having "vertically overlapping sound chambers."

In accordance with one embodiment of the invention, the vertically displaced asymmetric horn elements are configured so that there is no "overlap area" between the horn sound chambers. Hence, the horn elements do not have "vertically overlapping sound chambers." In this embodiment, the vertical longitudinal planes intersect behind the projections on a common horizontal plane of one or both of the sound expansion chambers.

In accordance with one embodiment of the invention, the vertically displaced asymmetric horn elements are configured so that there is a small "overlap area" between the horn sound chambers. Hence, the horn elements have "vertically overlapping sound chambers." In this embodiment, the vertical longitudinal planes intersect substantially at or near the projections on a common horizontal plane of the junctions of one or both of the sound expansion chambers and throats.

Referring to FIG. 19, in accordance with one embodiment of the invention, the vertically displaced asymmetric horn elements are configured so that there is an "overlap area" between the horn sound chambers. Hence, the horn elements have "vertically overlapping sound chambers." In this embodiment, the vertical longitudinal planes intersect within the projections on a common horizontal plane of the sound expansion chambers.

In accordance with one embodiment of the invention, the vertically displaced asymmetric horn elements are configured so that there is an "overlap area" between the horn sound chambers. Hence, the horn elements have "vertically overlapping sound chambers." In this embodiment, the vertical longitudinal planes intersect substantially at or near the projections on a common horizontal plane of one or both of the horn mouths.

In accordance with one embodiment of the invention, the vertically displaced asymmetric horn elements are configured so that there is substantially no "overlap area" between the horn sound chambers. Hence, the horn elements do not have "vertically overlapping sound chambers." In this embodiment, the vertical longitudinal planes intersect ahead or in front of the projections on a common horizontal plane of one or both of the horn mouths.

In accordance with one embodiment of the invention, the vertically displaced asymmetric horn elements are configured so that there is no "overlap area" between the horn sound chambers. Hence, the horn elements do not have "vertically overlapping sound chambers." In this embodiment, the vertical longitudinal planes intersect ahead or in front of the projections on a common horizontal plane of one or both of the horn element mouths.

The invention can be embodied with a plurality of cross-fired vertically divergent/convergent configurations. As defined above, the vertical divergence/convergence angle VDA is the angle between the projections of the outbound longitudinal axes 380, 380*a* on the bisecting vertical plane 396, and hence is a measure of the angular offset or angulation between the asymmetric horn elements 310, 310' and/or their respective sound expansion chambers 342, 362.

In one embodiment, and referring to FIG. 20, the vertically offset asymmetrical horn elements are oriented so that there is no intersection or crossover between the projections of the outbound longitudinal axes 380, 380*a* on the bisecting vertical plane 396. That is, VDA=0°, and the asymmetric horn elements can be said to be "vertically parallel." The horn elements can be shifted longitudinally or laterally, or both while maintaining their vertical parallelness (VDA=0°).

In another embodiment, the vertically offset asymmetrical horn elements are oriented to provide a vertically divergent asymmetric horn element stack. For a vertically divergent stack, in one embodiment, the horn element mouths point vertically outward away from one another and the projections of the outbound longitudinal axes on the bisecting vertical plane 396 intersect or crossover at a point behind the asymmetric horn element mouths. The angle between the projections of the outbound longitudinal axes on the bisecting vertical plane 396 is the vertical divergence angle of the asymmetric horn element stack. The lower asymmetric horn element outbound longitudinal axis is chosen as a "reference axis" to indicate a vertical divergence angle VDA>0°.

In yet another embodiment, the vertically offset asymmetric horn elements are oriented to provide a vertically convergent stack. For a vertically convergent stack, in one embodiment, the asymmetric horn element mouths point vertically inward towards one another and the projections of the outbound longitudinal axes on the bisecting vertical plane 396, intersect or crossover at a point ahead or in front of the asymmetric horn element stack. The lower asymmetric horn element outbound longitudinal axis is chosen as a “reference axis” to indicate a vertical convergence angle VDA<0°.

Asymmetric Multi-Way System

Figure 21:
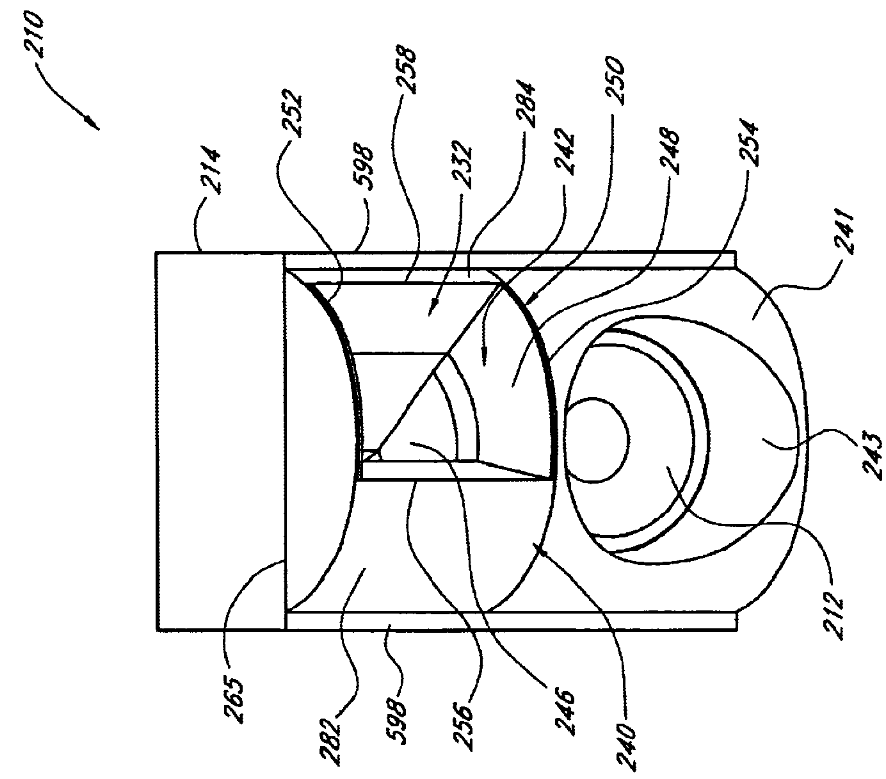
FIG. 21 is a schematic front perspective view of an asymmetric multi-way speaker system with an asymmetric horn element in accordance with one embodiment of the invention.
Figure 22:
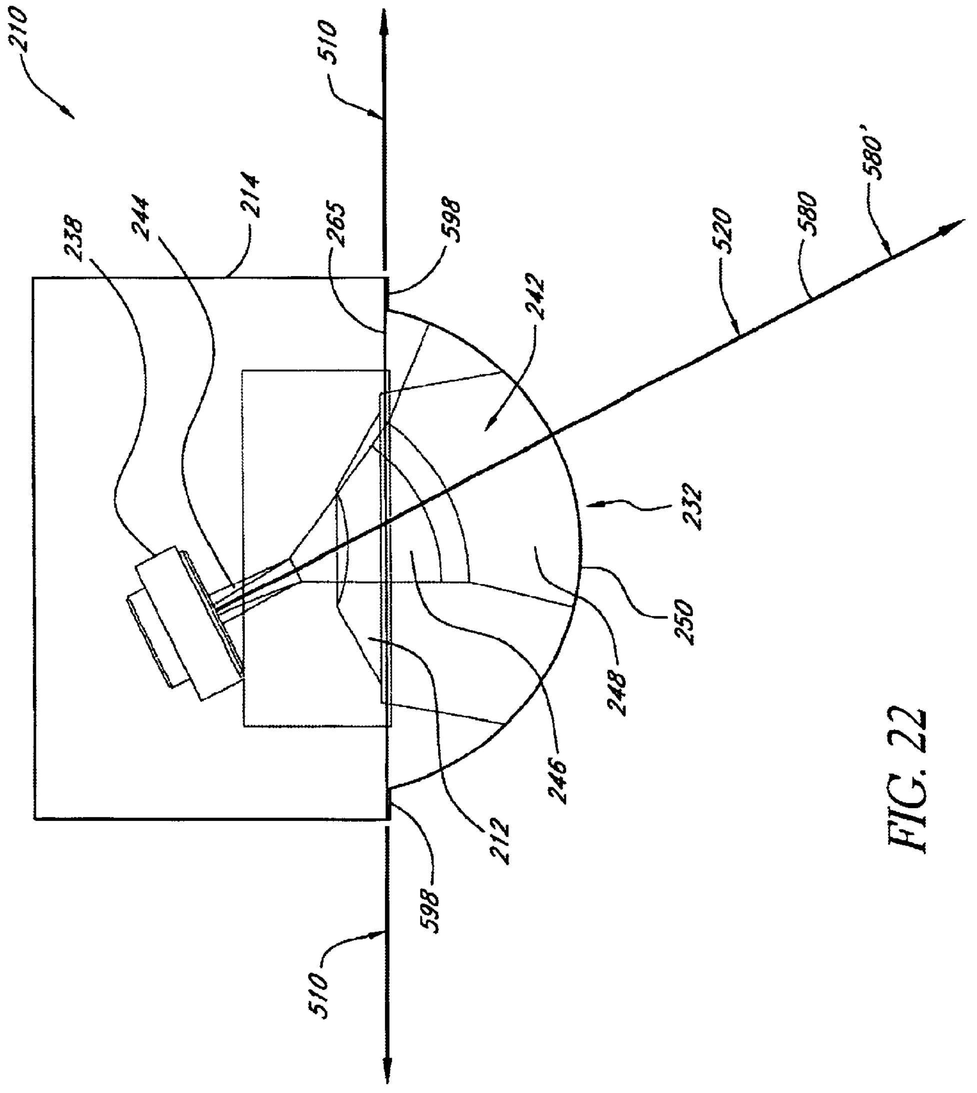
FIG. 22 is a schematic top plan view of the asymmetric multi-way speaker system of FIG. 21 illustrating the orientation of the horn element longitudinal plane with respect to the reference plane.

FIGS. 21 and 22 show frontal and top views of an asymmetric multi-way speaker sound system 210 with one asymmetric horn element, section or module 232 and having features in accordance with one embodiment of the invention. The speaker assembly 210 generally comprises an asymmetric horn element/module/section 232 and a woofer or low frequency sound source 212 housed or mounted in a speaker enclosure, body, support structure or frame 214 and a means for aligning/mounting/combining a second asymmetric multi-way system, inverted and vertically displaced, in a manner to provide a crossfire angle between the asymmetric horn elements.

Figure 23:
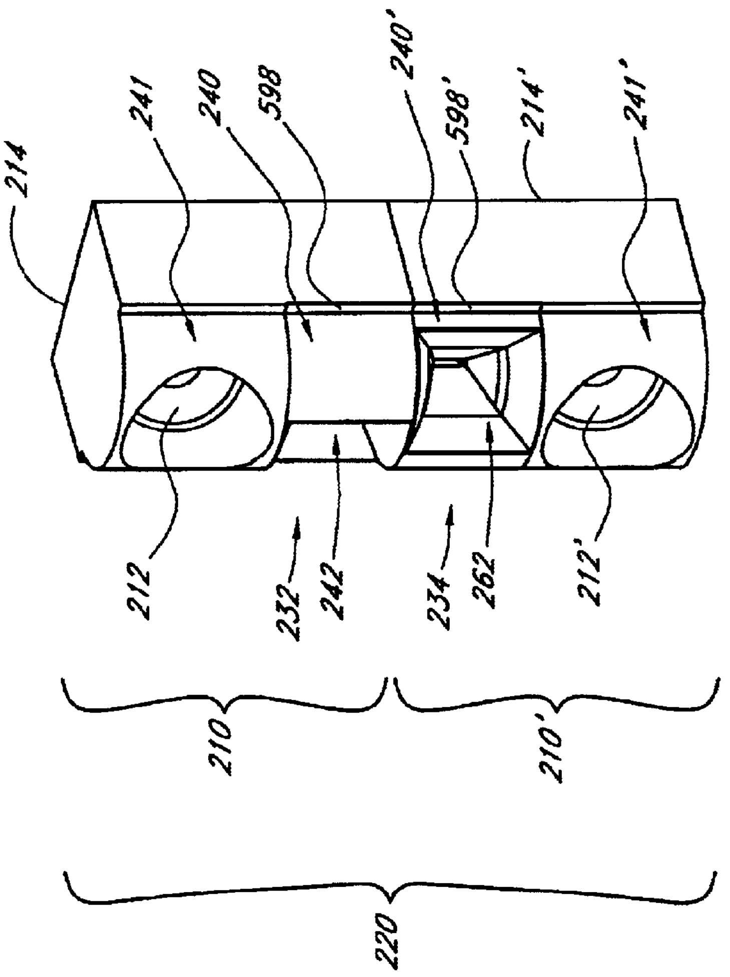
FIG. 23 is a schematic perspective view of a stack of multi-way speaker systems with each including an asymmetric horn element in accordance with one embodiment of the invention.

In one embodiment, as discussed in greater detail later herein, a reference plane 510 is specified at a predetermined angle with regard to the nominal dispersion angle of the asymmetric horn element 232 and the required or desired degree of crossfire of a vertical stack of asymmetric multi-way systems. FIG. 23 shows a perspective view of an asymmetric multi-way system stack generally comprising two asymmetric multi-way systems, with coincident reference planes, one inverted and vertically displaced, and providing a cross-fire angle between the asymmetric horn elements. Two or more asymmetric multi-way speaker sound systems arranged, for example, in a vertical stack with a cross-fired orientation provide a desirably wide horizontal directivity response, a narrow vertical directivity response, and an extended low frequency response.

In one embodiment, mounting flange sections 598 are integrally formed or molded with the asymmetric horn element 232 and are coincident with the reference plane 510. The horn element 232 is mounted to the speaker enclosure, body, support structure or frame 214, whose mounting surface 265 is coincident with the reference plane 510. The woofer or low frequency sound source 212 is mounted to the enclosure 214 in a manner parallel to the reference plane 510.

In one embodiment, the mounting flange sections 598 of the asymmetric horn element 232 are parallel to and displaced from the reference plane 510. In another embodiment, the mounting surface 265 of the enclosure 214 is parallel to and displaced from the reference plane 510. In a further embodiment, the woofer 212 is mounted parallel to and displaced from the reference plane 510. In yet a further embodiment, the woofer 212 is mounted in a manner not parallel to the reference plane.

The asymmetric horn element 232 comprises a sound expansion chamber 242 in acoustical communication with a throat 244 which in turn is connected to a compression driver unit or assembly 238. In one embodiment, the throat 244 and driver 238 are enclosed within the speaker body 214. The sound expansion chamber 242 includes a generally flared bell 246 portion or section and a generally flared flange portion or section 248 which forms a mouth 250 at the sound radiating end of the horn 232.

In one embodiment, the mouth 250 has substantially radial top and bottom edges 252, 254 in the horizontal plane, with generally straight side edges 256, 258 in the vertical plane, and a substantially rectangular cross-sectional shape in a projection on a plane normal to the outbound longitudinal axis 580 (as defined above; note that the horn element longitudinal axis is labeled by the reference numeral 580' in FIG. 22). In other embodiments, the horn element mouth edges 252, 254, 256, 258 may be shaped in a wide variety of manners, for example, curved, straight or irregular, among others, in both the horizontal and/or vertical planes, and the mouth cross-section may be shaped in a wide variety of manners, for example, rectangular, square, oval, round or irregular, among others, in a projection on a plane normal to the outbound longitudinal axis 580.

In one embodiment, a baffle system or structure is integrally formed or molded with the asymmetric horn element 232. This further improves the acoustical performance. The baffling 240 functions to substantially prevent or mitigate undesirable diffraction and interaction between sound waves broadcasted from the asymmetric horn element mouth 250 and sound waves reflected or reradiated by the enclosure 214 and/or radiated or “broadcasted” by the woofer 212. In other embodiments, the asymmetric horn element 232 can be mounted or housed in the baffling 240. As the skilled artisan will realize, the horn 232 and the baffling 240 can be coupled to one another utilizing a wide variety of techniques, for example, screws, nut-bolt combinations, rivets, clamps, adhesives, or combinations thereof, among others.

In one embodiment, the baffle system 240 is generally associated with the sides of the sound expansion chamber 242 near the mouth 250. In one embodiment, the baffling 240 is in mechanical communication with the sound expansion chamber 242. The baffling 240 generally comprises baffle elements 282, 284. The baffle elements 282, 284 are associated with the sound expansion chamber 242 near the mouth 250 with the baffle element 282 being substantially wider than the baffle element 284.

In one embodiment, the baffle elements 282, 284 curve in the horizontal direction. In other embodiments, one or both of the baffle elements 282, 284 can curve in the horizontal and vertical directions or only in the vertical direction. In yet other embodiments, one or more baffle elements can be straight, curved, or irregular, among others, in the horizontal direction and/or vertical direction.

In other embodiments, the baffle system 240 can be configured and dimensioned in a wide variety of manners with efficacy, as required or desired, giving due consideration to the goal of achieving one or more of the benefits and advantages as taught or suggested herein. Baffle elements and/or cap elements can also be provided above and below the sound expansion chamber 242, giving due consideration to the goal of further enhancing the acoustical performance of the asymmetric horn element 232 of the invention.

Referring again to FIG. 21, the asymmetric multi-way speaker system 210 includes a woofer baffling 241. In one embodiment, the woofer baffling 241 generally matches the horn baffling 240 and is generally associated with the sides of the woofer 212 or substantially circumscribes the woofer 212. In another embodiment, the horn baffling 240 and the woofer baffling 241 are separate units. In yet another embodiment, a fully integrated asymmetric multi-way speaker system 210 is provided with the horn sound expansion chamber 242, the horn baffling 240, and the woofer baffling 241 being formed as an integral unit, for example, by injection molding. In a further embodiment, the speaker enclosure 214 is integrally formed into the asymmetric multi-way system 210.

In one embodiment, the horn baffling 240 is substantially curved or radial in the horizontal direction and the woofer baffling 241 is curved or radial in the horizontal direction. An internal surface 243 of the woofer baffling 241 generally fans out, flares, or provides for an acoustical expansion. This further accentuates the performance of the woofer 212 and hence that of the asymmetric multi-way speaker system 210. In further embodiments, the horn and/or woofer baffle elements can curve in the vertical direction or in both the horizontal and vertical directions. In further embodiments, the woofer baffling 241 is flat, stepped or irregular. In another embodiment, the multi-way asymmetric system 210 comprises more than one or a plurality of woofers 212.

Asymmetric Multi-Way System Stack

Figure 24:
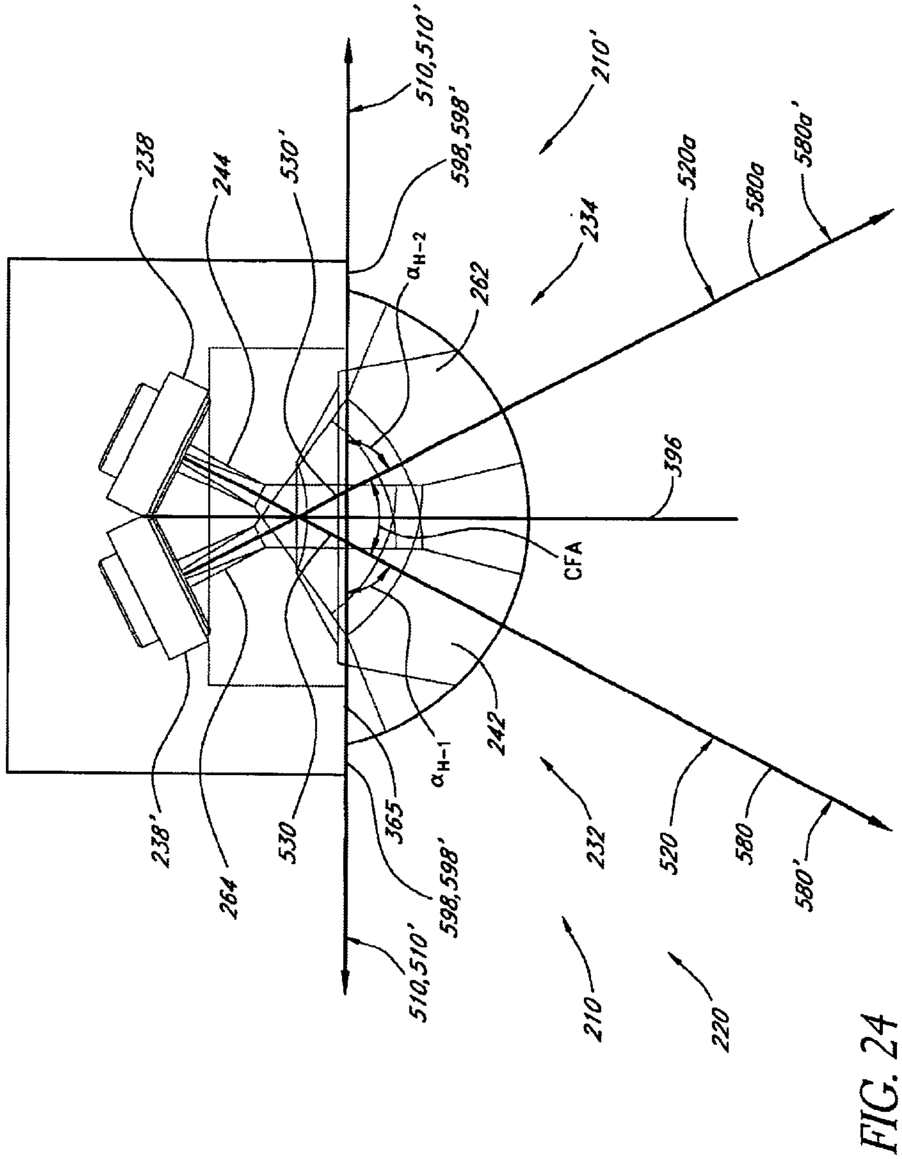
FIG. 24 is a schematic top plan view of the stack of multi-way speaker systems of FIG. 23.
Figure 25:
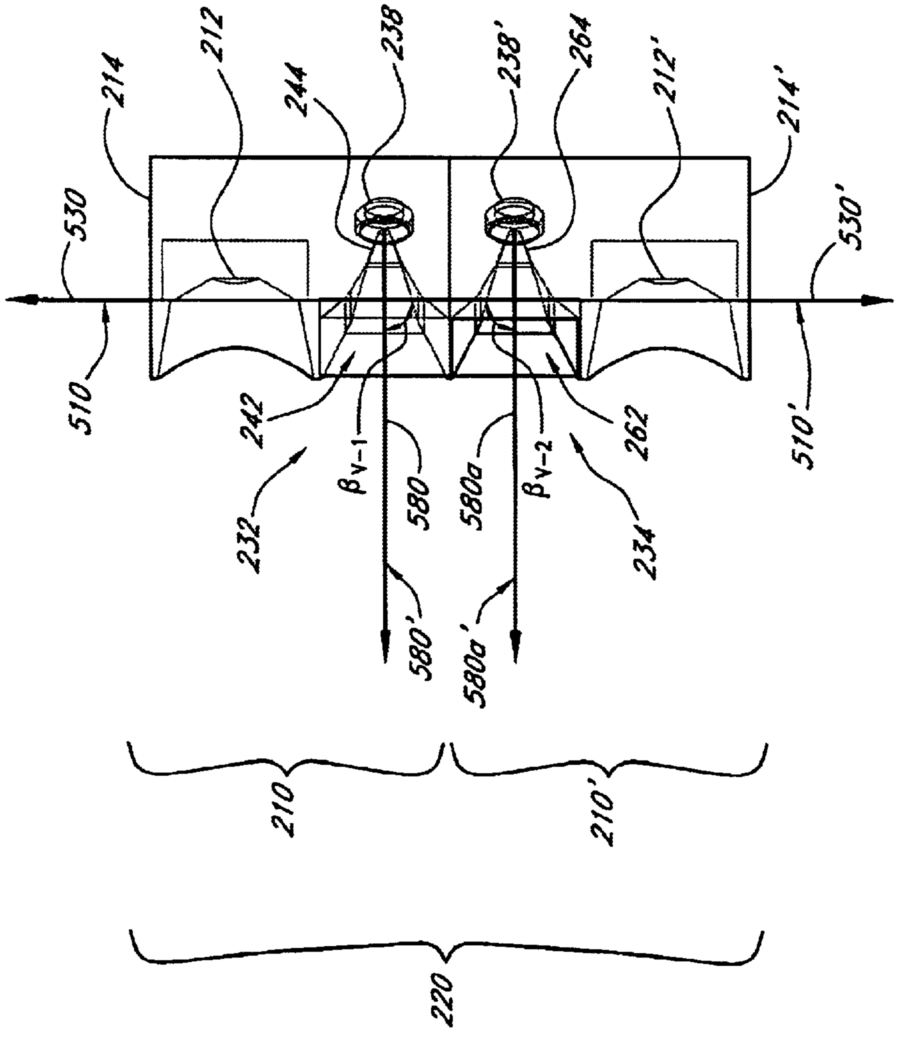
FIG. 25 is a schematic side elevation view of the stack of multi-way speaker systems of FIG. 23.

FIGS. 23 through 25 show perspective, top, and side views of a stack, system, assembly or combination 220 comprising two asymmetric multi-way systems 210, 210' and having features in accordance with one embodiment of the invention. The stack 220 includes respective asymmetric multi-way system elements 210, 210' aligned/mounted/combined with coincident reference planes 510, 510', one inverted and vertically displaced, and providing a crossfire angle between the asymmetric horn elements 232, 234. The asymmetry refers to the off-axis orientation of the asymmetric sound expansion chambers 242, 262 with respect to their respective reference planes 510, 510'. One advantage of the asymmetric multi-way system stack 220 is that it provides a desirably wide horizontal directivity response, a narrow vertical directivity response, and an extended low frequency response.

Two or more asymmetric multi-way systems can be stacked, vertically displaced and providing a crossfire angle between the horns, as required or desired, giving due consideration to the goal of achieving one or more of the benefits and advantages as taught or suggested herein. The structure of the asymmetric multi-way system 210 has been described above, and the basic structure of the second asymmetric multi-way system 210' is of a generally similar nature. The asymmetric horn elements 232, 234 include respective sound expansion chambers 242, 262 in acoustical communication with respective throats 244, 264 which in turn are connected to respective compression drivers 238, 238'. In one embodiment, the throats 244, 264 and drivers 238, 238' are enclosed within the speaker bodies 214, 214'.

In one embodiment, the asymmetric horn elements 232, 234, woofers 212, 212', enclosures 214, 214', horn bafflings 240, 240'and woofer bafflings 241, 241' are configured and/or dimensioned substantially identically. In another embodiment, the asymmetric horn elements 232, 234, woofers 212, 212', enclosures 214, 214', horn bafflings 240, 240' and woofer bafflings 241, 241' comprise different dimensions. The mounting flanges of the asymmetric horn element 234 are labeled as 598' in FIGS. 23–24 and the mounting surface of the enclosure 214' is labeled as 265' in FIG. 24.

The asymmetric horn elements 232, 234 can be oriented in a wide variety of manners to provide a wide range of cross-fire angles (CFA) and vertical divergence/convergence angles (VDA), as required or desired, giving due consideration to the goals of achieving one or more of the benefits and advantages as taught or suggested herein.

Referring to FIG. 23, the stack 220 is formed with autonomous respective upper and lower asymmetric multi-way systems 210, 210'. In another embodiment, the upper and lower asymmetric multi-way systems 210, 210' can be integrally formed to provide an integral unit or stack 220.

Referring to FIG. 24 (top view), the vertical longitudinal plane 520 of the upper asymmetric multi-way system 210 is a vertical plane through the outbound longitudinal axis 580 of the upper asymmetric horn element 232. The upper horn longitudinal axis is labeled by the reference numeral 580'. The vertical longitudinal plane 520 intersects a reference plane 510 at an angle not equal to 90°. The upper multi-way system asymmetry is a consequence of the vertical longitudinal plane 520 not being orthogonal to the reference plane 510, that is, at an angle not equal to 90°.

Referring again to FIG. 24, the vertical longitudinal plane **520*a* of the lower asymmetric multi-way system 210' is a vertical plane through the outbound longitudinal axis 580*a* of the lower asymmetric horn element 234. The lower horn longitudinal axis is labeled by the reference numeral 580*a*'. The vertical longitudinal plane 520*a* intersects a reference plane 510' at an angle not equal to 90°. The lower multi-way system asymmetry is a consequence of the vertical longitudinal plane 520*a* not being orthogonal to the reference plane 510'**, that is, at an angle not equal to 90°.

As illustrated in FIG. 24, the reference plane 510 of the upper asymmetric multi-way system 210 intersects the vertical longitudinal plane 520 at an angle given by the following relation:

$$\alpha_{H-1} = 90 - \frac{NDA_{H-1}}{K} \tag{12}$$

where, $\alpha_{H-1}$ is the horizontal asymmetry angle of the upper asymmetric multi-way system 210, $NDA_{H-1}$ is the nominal horizontal dispersion angle of the upper asymmetric horn element 232 and K is a parameter that defines the degree of cross-fire of the horn elements 232, 234 of the asymmetric multi-way system stack 220.

As further illustrated in FIG. 24, the reference plane 510' of the lower asymmetric multi-way system 210' intersects the vertical longitudinal plane **520*a*** at an angle given by the following relation:

$$\alpha_{H-2} = 90 - \frac{NDA_{H-2}}{K} \tag{13}$$

where, $\alpha_{H-2}$ is the horizontal asymmetry angle of the lower asymmetric multi-way system 210', $NDA_{H-2}$ is the nominal horizontal dispersion angle of the lower asymmetric horn element 234 and K is a parameter that defines the degree of cross-fire of the horn elements 232, 234 of the asymmetric multi-way system stack 220.

Equation or expression (14) permits two asymmetric multi-way systems 210, 210', vertically displaced and with parallel reference planes 510, 510', one inverted with respect to the other, to provide a predetermined cross-fire angle CFA given by:

$$CFA = 180 - \alpha_{H-1} - \alpha_{H-2} \tag{14}$$

where $\alpha_{H-1}$ refers to the angle between the reference plane 510 of the upper asymmetric multi-way system 210 and the vertical longitudinal plane 520 and $\alpha_{H-2}$ refers to the angle between the reference plane 510' of the lower asymmetric system 210' and the vertical longitudinal plane **520*a***.

In one embodiment, K=2, and the cross-fire angle CFA is the average of the nominal horizontal dispersion angles of the two asymmetric horn elements 232, 234 of the asymmetric multi-way system stack 220. In another embodiment, $1 < K \leqq 4$. In a further embodiment $1.5 \leqq K \leqq 3$. In other embodiments, K can be selected, as required or desired, to achieve a cross-fired angle in the range from $0° < CFA < 180°$.

As illustrated in FIGS. 24 and 25, the vertical reference axis 530 of the upper horn element 232 is a vertical axis located at or through the intersection of the vertical longitudinal plane 520 and the reference plane 510. The vertical reference axis 530' of the lower horn element 234 is a vertical axis located at or through the intersection of the vertical longitudinal plane **520*a* and the reference plane 510'**.

As illustrated by FIG. 25 (side view), the vertical reference axis 530 and hence the reference plane 510 is oriented with respect to the outbound longitudinal axis 580 by a predetermined vertical asymmetry angle $\beta_{V-1}$ (in degrees) given by the expression:

$$\beta_{V-1} = 90 - \frac{NDA_{V-1}}{C} \quad (15)$$

where, $\beta_{V-1}$ is the vertical asymmetry angle of the upper asymmetric multi-way system 210, $NDA_{V-1}$ is the nominal vertical dispersion angle of the upper asymmetric horn element 232 and C is a parameter that defines the degree of vertical divergence/convergence of the horn elements 232, 234 of the asymmetric multiway system stack 220.

As further illustrated by FIG. 25, the vertical reference axis 530' and hence the reference plane 510' is oriented with respect to the outbound longitudinal axis 580*a* by a predetermined vertical asymmetry angle $\beta_{V-2}$ (in degrees) given by the expression:

$$\beta_{V-2} = 90 - \frac{NDA_{V-2}}{C} \quad (16)$$

where, $\beta_{V-2}$ is the vertical asymmetry angle of the lower asymmetric multi-way system 210', $NDA_{V-2}$ is the nominal vertical dispersion angle of the lower asymmetric horn element 234 and C is a parameter that defines the degree of vertical divergence/convergence of the horn elements 232, 234 of the asymmetric multiway system stack 220.

Equation (17) permits two asymmetric multi-way systems 210, 210', one inverted and vertically displaced and with parallel reference planes 510, 510', to provide a predetermined vertical divergence/convergence angle given by:

$$VDA = 180 - \beta_{V-1} - \beta_{V-2} \quad (17)$$

where $\beta_{V-1}$ refers to the angle between the vertical reference axis 530 of the upper asymmetric multi-way system 210 and the outbound longitudinal axis 580 and $\beta_{V-2}$ refers to the angle between the vertical reference axis 530' of the lower asymmetric multi-way system 210' and the outbound longitudinal plane 580*a*.

In one embodiment, $C=\pm\infty$, and hence VDA=0° so that the two asymmetric multi-way systems 210, 210' are vertically parallel. Note that divergence is indicated by VDA>0° and convergence is indicated by VDA<0°, as discussed above. In one vertically divergent embodiment, $3 \leqq C < \infty$. In another vertically divergent embodiment, $1.3 \leqq C < 3$. In yet another vertically divergent embodiment, $0.10 \leqq C < 1.3$. In one vertically convergent embodiment, $-\infty < C \leqq -3$. In another vertically convergent embodiment, $-3 < C \leqq -1.3$. In yet another vertically convergent embodiment, $-1.3 < C \leqq -0.10$. In other embodiments, C can be selected, as required or desired, to achieve a vertical divergence/convergence angle in the range from −180° to 180°, that is, $-180° \leqq VDA \leqq 180°$.

The horizontal asymmetry angles, the cross-fire angles, the vertical asymmetry angles, and/or the vertical divergence/convergence angles can be selected in a wide variety of manners with efficacy, as required or desired, giving due consideration to the goal of achieving one or more of the benefits and advantages as taught or suggested herein. This adds to the versatility of the invention, for example in the choice of coverage angles, among others.

While the components and techniques of the present invention have been described with a certain degree of particularity, it is manifest that many changes may be made in the specific designs, constructions and methodology hereinabove described without departing from the spirit and scope of this disclosure. It should be understood that the invention is not limited to the embodiments set forth herein for purposes of exemplification, but is to be defined only by a fair reading of the appended claims, including the full range of equivalency to which each element thereof is entitled.

What is claimed is:

1. A loudspeaker horn apparatus for broadcasting acoustic signals generated by a driver, comprising:

a common throat for receiving said signals from a driver;

first and second sound expansion chambers connected to receive the signals from the common throat;

the common throat and the sound expansion chambers forming first and second sound paths for propagating said acoustic signals from the driver through said loudspeaker apparatus; and the sound expansion chambers oriented such that first and second lines coincident with the longitudinal axis of the first and second sound chambers, respectively, are vertically offset and intersect at a point downstream of the common throat when projected onto a horizontal plane.

2. The apparatus of claim 1 wherein the first and second lines intersect at a point downstream of the expansion chambers when projected onto a horizontal plane.

3. The apparatus of claim 1 wherein the first and second sound chambers are vertically displaced and partially overlap.

4. The apparatus of claim 3 wherein the first and second lines intersect when projected onto a horizontal plane generally in the area where the first and second sound chambers partially overlap.

5. The apparatus of claim 1 wherein the first and second lines form a crossfire angle (CFA) defined by:

$$CFA = \frac{NDA_{H-1} + NDA_{H-2}}{K}$$

where $NDA_{H-1}$ is the nominal horizontal dispersion angle of the first expansion chamber, $NDA_{H-2}$ is the nominal horizontal dispersion angle of the second expansion chamber and K is between one and four.

6. The apparatus of claim 5 wherein K is approximately within the range of 1.5 to 3.

7. The apparatus of claim 1 wherein the first and second lines intersect at an angle VDA when projected onto a vertical plane, the angle VDA being defined by:

$$VDA = \frac{NDA_{V-1} + NDA_{V-2}}{C}$$

where $NDA_{V-1}$ is the nominal vertical dispersion angle of the first expansion chamber, $NDA_{V-2}$ is the nominal vertical dispersion angle of the second expansion chamber, and C is a parameter that defines the degree of vertical divergence or convergence.

8. The apparatus of claim 7 wherein C is approximately equal to or greater than 3.0 or approximately less than or equal to −3.0.

9. The apparatus of claim 7 wherein C is approximately within the range of 1.3 to 3.0, or approximately within the range of −3.0 to −1.3.

10. The apparatus of claim 1 wherein the first sound expansion chamber is a horn.

11. The apparatus of claim 1 wherein the second sound expansion chamber is a horn.

12. The apparatus of claim 1 further comprising a substantially asymmetric baffling system in mechanical communication with a mouth of at least one of the sound chambers.

13. The apparatus of claim 12 wherein the asymmetric baffling system curves when projected onto a horizontal plane.

14. The apparatus of claim 12 wherein the asymmetric baffling system is straight when projected onto a vertical plane.

15. The apparatus of claim 12 wherein the first sound expansion chamber, the second sound expansion chamber and the substantially asymmetric baffling system are integrally formed.

16. The apparatus of claim 12 wherein the first and second sound expansion chambers and the asymmetric baffling system are formed by an injection molding process.

17. The apparatus of claim 12 wherein the first and second sound expansion chambers comprise non-resonant material.

18. The apparatus of claim 12 wherein the asymmetric baffling system comprises a first baffle that is associated with a first edge portion of the first expansion chamber and a second baffle that is associated with a second edge portion of the first expansion chamber.

19. The apparatus of claim 18 wherein the first baffle is wider than the second baffle.

20. The apparatus of claim 18 wherein the first baffle and the second sound chamber are vertically displaced and at least partially overlap.

21. The apparatus of claim 18 wherein the asymmetric baffling system further comprises a third baffle that is associated with a first edge portion of the second expansion chamber and a fourth baffle that is associated with a second edge portion of the second expansion chamber.

22. The apparatus of claim 21 wherein the third baffle is wider than the fourth baffle.

23. The apparatus of claim 21 wherein the first baffle and the third baffle are vertically displaced and partially overlap.

24. The apparatus of claim 1 wherein the first sound expansion chamber comprises a flared internal surface.

25. The apparatus of claim 1 wherein the first sound expansion chamber comprises a bell portion and a flange portion.

26. The apparatus of claim 25 wherein the bell portion is formed with a flared internal surface.

27. The apparatus of claim 26 wherein the flared internal surface of the bell portion is substantially conical.

28. The apparatus of claim 26 wherein the flared internal surface of the bell portion is substantially frusto-conical.

29. The apparatus of claim 24 wherein the flared internal surface comprises a flange portion.

30. The apparatus of claim 29 wherein the flange portion comprises an internal surface that is substantially conical.

31. The apparatus of claim 29 wherein the flange portion comprises an internal surface that is substantially frusto-conical.

32. The apparatus of claim 1 further comprising a woofer enclosure.

33. The apparatus of claim 1 wherein the first and second sound chambers are vertically displaced relative to a woofer.

34. The apparatus of claim 32 wherein the woofer enclosure, the first sound chamber and second sound chamber are formed as an integral unit.

35. The apparatus of claim 32 wherein the woofer enclosure, the first sound chamber and second sound chamber are formed as an integral unit by injection molding.

36. The apparatus of claim 32 further comprising woofer baffling that is in mechanical communication with the woofer enclosure.

37. The apparatus of claim 36 wherein the woofer baffling is located between the woofer enclosure and one of the first or second sound chambers.

38. The apparatus of claim 36 wherein the woofer baffling partially circumscribes a woofer.

39. The apparatus of claim 36 wherein the woofer baffling radially curves when projected onto a horizontal plane.

40. The apparatus of claim 36 wherein the woofer baffling reduces the interaction of sound waves broadcasted from a woofer with sound waves broadcasted from the first and second sound chambers.

41. The apparatus of claim 36 wherein the woofer enclosure, the woofer baffling, the first sound chamber and second sound chamber are formed as an integral unit.

42. A method of manufacturing a horn system comprising:

connecting a driver to first and second sound chambers with a common throat such that the sound expansion chambers form first and second sound paths for propagating acoustic signals from the driver; and orienting the first and second sound expansion chambers such that first and second lines coincident with the longitudinal axis of the first and second sound chambers, respectively, are vertically offset and intersect at a point downstream of said common throat when projected onto a horizontal plane.

43. A loudspeaker horn apparatus for broadcasting acoustic signals generated by a driver, comprising:

a common throat for receiving said signals from a driver;

first and second sound expansion chambers connected to receive the signals from the common throat;

the common throat and the sound expansion chambers forming first and second sound paths for propagating said acoustic signals from the driver through said loudspeaker apparatus; and the sound expansion chambers oriented such that first and second lines coincident with the longitudinal axis of the first and second sound chambers, respectively, are vertically offset and intersect at a point downstream of the common throat when projected onto a horizontal plane, wherein the first and second lines form a cross-fire angle (CFA) defined by:

$$CFA = \frac{NDA_{H-1} + NDA_{H-2}}{K}$$

where $NDA_{H-1}$ is the nominal horizontal dispersion angle of the first expansion chamber, $NDA_{H-2}$ is the nominal horizontal dispersion angle of the second expansion chamber and K is between one and four.

44. The apparatus of claim 43 wherein K is approximately within the range of 1.5 to 3.

45. A loudspeaker horn apparatus for broadcasting acoustic signals generated by a driver, comprising:

a common throat for receiving said signals from a driver;

first and second sound expansion chambers connected to receive the signals from the common throat;

the common throat and the sound expansion chambers forming first and second sound paths for propagating said acoustic signals from the driver through said loudspeaker apparatus; and the sound expansion chambers oriented such that first and second lines coincident with the longitudinal axis of the first and second sound chambers, respectively, are vertically offset and intersect at a point downstream of the common throat when projected onto a horizontal plane, wherein the first and second lines intersect at an angle VDA when projected onto a vertical plane, the angle VDA being defined by:

$$VDA = \frac{NDA_{V-1} + NDA_{V-2}}{C}$$

where $NDA_{V-1}$ is the nominal vertical dispersion angle of the first expansion chamber, $NDA_{V-2}$ is the nominal vertical dispersion angle of the second expansion chamber, and C is a parameter that defines the degree of vertical divergence or convergence.

46. The apparatus of claim 45 wherein C is approximately equal to or greater than 3.0 or approximately less than or equal to −3.0.

47. The apparatus of claim 45 wherein C is approximately within the range of 1.3 to 3.0, or approximately within the range of −3.0 to −1.3.

48. A loudspeaker horn apparatus for broadcasting acoustic signals generated by a driver, comprising:

a common throat for receiving said signals from a driver;

first and second sound expansion chambers connected to receive the signals from the common throat;

the common throat and the sound expansion chambers forming first and second sound paths for propagating said acoustic signals from the driver through said loudspeaker apparatus; and the sound expansion chambers oriented such that first and second lines coincident with the longitudinal axis of the first and second sound chambers, respectively, are vertically offset and intersect at a point downstream of the common throat when projected onto a horizontal plane, further comprising a substantially asymmetric baffling system in mechanical communication with a mouth of at least one of the sound chambers.

49. The apparatus of claim 48 wherein the asymmetric baffling system curves when projected onto a horizontal plane.

50. The apparatus of claim 48 wherein the asymmetric baffling system is straight when projected onto a vertical plane.

51. The apparatus of claim 48 wherein the first sound expansion chamber, the second sound expansion chamber and the substantially asymmetric baffling system are integrally formed.

52. The apparatus of claim 48 wherein the first and second sound expansion chambers and the asymmetric baffling system are formed by an injection molding process.

53. The apparatus of claim 48 wherein the first and second sound expansion chambers comprise non-resonant material.

54. The apparatus of claim 48 wherein the asymmetric baffling system comprises a first baffle that is associated with a first edge portion of the first expansion chamber and a second baffle that is associated with a second edge portion of the first expansion chamber.

55. The apparatus of claim 54 wherein the first baffle is wider than the second baffle.

56. The apparatus of claim 54 wherein the first baffle and the second sound chamber are vertically displaced and at least partially overlap.

57. The apparatus of claim 54 wherein the asymmetric baffling system further comprises a third baffle that is associated with a first edge portion of the second expansion chamber and a fourth baffle that is associated with a second edge portion of the second expansion chamber.

58. The apparatus of claim 57 wherein the third baffle is wider than the fourth baffle.

59. The apparatus of claim 57 wherein the first baffle and the third baffle are vertically displaced and partially overlap.

* * * * *